United States Patent
Lee et al.

(10) Patent No.: US 12,382,772 B2
(45) Date of Patent: Aug. 5, 2025

(54) LIGHT EMITTING DEVICE AND LED DISPLAY APPARATUS INCLUDING THE SAME

(71) Applicant: SEOUL VIOSYS CO., LTD., Ansan-si (KR)

(72) Inventors: Chung Hoon Lee, Ansan-si (KR); So Ra Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/625,783

(22) Filed: Apr. 3, 2024

(65) Prior Publication Data
US 2024/0266386 A1    Aug. 8, 2024

Related U.S. Application Data

(63) Continuation of application No. 18/224,251, filed on Jul. 20, 2023, now Pat. No. 11,961,876, which is a
(Continued)

(51) Int. Cl.
*H10H 29/14*    (2025.01)
*H10H 20/813*    (2025.01)
(Continued)

(52) U.S. Cl.
CPC ........ *H10H 29/142* (2025.01); *H10H 20/813* (2025.01); *H10H 20/814* (2025.01); *H10H 20/8312* (2025.01); *H10H 20/857* (2025.01)

(58) Field of Classification Search
None
See application file for complete search history.

(56) References Cited

U.S. PATENT DOCUMENTS

| | | |
|---|---|---|
| 2012/0229774 A1 | 9/2012 | Mochizuki |
| 2014/0131729 A1 | 5/2014 | Heo et al. |

(Continued)

FOREIGN PATENT DOCUMENTS

| | | |
|---|---|---|
| CN | 102683512 A | 9/2012 |
| KR | 10-2015-0025502 A | 3/2015 |

(Continued)

OTHER PUBLICATIONS

International Search Report for International Application No. PCT/KR2020/019495, mailed Apr. 26, 2021, English Translation, 2 pages.

(Continued)

*Primary Examiner* — Sue A Purvis
*Assistant Examiner* — Jordan M Klein
(74) *Attorney, Agent, or Firm* — Oblon, McClelland, Maier & Neustadt, L.L.P.

(57) ABSTRACT

A display apparatus includes a display substrate, and light emitting devices arranged on an upper surface of the display substrate. At least one of the light emitting devices includes a first LED unit including a first light emitting stack, a second LED unit including a second light emitting stack, and a third LED unit including a third light emitting stack. Each of the first to third light emitting stacks includes a first conductivity type semiconductor layer and a second conductivity type semiconductor layer. the first conductivity type semiconductor layer and the second conductivity type semiconductor layer in each of the first to third light emitting stacks are stacked in a horizontal direction with respect to the upper surface of the display substrate. At least one of the second conductivity type semiconductor layers in the first to third light emitting stacks is divided into two regions.

19 Claims, 16 Drawing Sheets

Related U.S. Application Data continuation of application No. 17/134,985, filed on Dec. 28, 2020, now Pat. No. 11,749,708.

(60) Provisional application No. 63/008,128, filed on Apr. 10, 2020, provisional application No. 62/956,980, filed on Jan. 3, 2020.

(51) Int. Cl.
*H10H 20/814* (2025.01)
*H10H 20/831* (2025.01)
*H10H 20/857* (2025.01)

(56) References Cited

U.S. PATENT DOCUMENTS

| | | | |
|---|---|---|---|
| 2014/0186979 A1 | 7/2014 | Tu et al. | |
| 2015/0069452 A1* | 3/2015 | Zanotto | F21V 19/005 |
| | | | 438/23 |
| 2015/0169011 A1* | 6/2015 | Bibl | H01L 23/5386 |
| | | | 345/175 |
| 2016/0005789 A1* | 1/2016 | Rhee | H10H 29/142 |
| | | | 257/89 |
| 2016/0259368 A1 | 9/2016 | Bibi et al. | |
| 2016/0365382 A1* | 12/2016 | Seo | H10H 20/8312 |
| 2018/0198020 A1 | 7/2018 | Lai et al. | |
| 2018/0341055 A1 | 11/2018 | Yuan et al. | |
| 2019/0088819 A1* | 3/2019 | Ting | H10H 20/813 |
| 2019/0164944 A1 | 5/2019 | Chae et al. | |
| 2019/0165038 A1 | 5/2019 | Chae et al. | |
| 2020/0135126 A1* | 4/2020 | Yokoyama | G09G 3/3648 |
| 2021/0375980 A1 | 12/2021 | Jang et al. | |

FOREIGN PATENT DOCUMENTS

| | | |
|---|---|---|
| KR | 1020160059576 A | 5/2016 |
| KR | 1020190069869 A | 6/2019 |
| KR | 1020190115838 A | 10/2019 |
| KR | 1020190143840 A | 12/2019 |
| WO | WO 2019/102955 A1 | 5/2019 |

OTHER PUBLICATIONS

Office action for U.S. Appl. No. 17/134,985, mailed Mar. 2, 2023, 20 pages.

Notice of allowance for U.S. Appl. No. 17/134,985, mailed Jun. 29, 2023, 8 pages.

Korean Office Action issued Feb. 18, 2025 in Korean Patent Application No. 10-2022-7020542, 7 pages.

Office Action mailed May 29, 2025 in Chine Application No. 202080091651.X filed Dec. 31, 2020 (w/English translation).

* cited by examiner

LIGHT EMITTING DEVICE AND LED DISPLAY APPARATUS INCLUDING THE SAME

CROSS-REFERENCE TO RELATED APPLICATIONS AND PRIORITY

The present application is a continuation of U.S. application Ser. No. 18/224,251 filed Jul. 20, 2023, which is a continuation of U.S. application Ser. No. 17/134,985 filed Dec. 28, 2020, now U.S. Pat. No. 11,749,708, issued Sep. 5, 2023 which is a Non-provisional Application which claims the benefit of and priority to Provisional Application Nos. 63/008,128, filed on Apr. 10, 2020, and 62/956,980, filed on Jan. 3, 2020, the disclosures of which are incorporated herein by their entirety.

TECHNICAL FIELD

Exemplary embodiments of the present disclosure relate to a light emitting device and a light emitting diode (LED) display apparatus including the same.

BACKGROUND

A light emitting diode (LED) is an inorganic light source and is used in various fields, such as a display apparatus, a vehicular lamp, general lighting, and the like. With various advantages including long lifespan, low power consumption, and rapid response, light emitting diodes have rapidly replaced existing light sources.

A typical light emitting diode is generally used as a backlight source in a display apparatus. In recent years, an LED display adapted to realize a direct image using light emitting diodes is available Such an LED display is referred to as a micro-LED display or a mini-LED display depending upon the size of light emitting devices.

In general, a display apparatus realizes various colors using a mixture of blue light, green light and red light. The display apparatus includes multiple pixels in order to realize various images, in which each of the pixels includes blue, green and red subpixels, a color of a certain pixel is determined through combination of colors of these subpixels, and an image is realized through combination of these pixels.

Since an LED emits light of various colors depending upon materials thereof, the display apparatus may be manufactured by arranging individual light emitting devices configured to emit blue light, green light and red light in a two-dimensional plane. However, arrangement of one light emitting device on each subpixel increases the number of light emitting devices, thereby causing increase in time consumption in a mounting process.

SUMMARY

In order to reduce time consumption in the mounting process, a stack type light emitting device has been considered. For example, light of red, blue and green colors may be realized using a light emitting device manufactured by stacking a red LED, a blue LED and a green LED. As a result, it is possible to provide one pixel capable of emitting red, blue and green colors through one light emitting device, thereby enabling reduction in the number of light emitting devices mounted in the display apparatus to ⅓ of the number of light emitting devices used in the related art.

However, in a typical stack type light emitting device, light emitted from an LED disposed at a lower side thereof is discharged after passing through LEDs disposed on the LED at the lower side. Accordingly, there is a need for restriction of the stacking sequence of the LEDs in consideration of light absorption. Moreover, light emitting regions of the LEDs stacked one above another are affected by electrodes connected to each of the LEDs.

On the other hand, if failure of some light emitting devices may occur in manufacture or use of an LED display apparatus, defective light emitting devices including micro-LEDs or mini-LEDs may be repaired into good light emitting devices with ease.

Exemplary embodiments of the present disclosure provide a light emitting device having a novel structure suitable for an LED display apparatus and an LED display apparatus including the same.

Exemplary embodiments of the present disclosure provide an LED display apparatus allowing change of a stacking sequence of LEDs without being restricted by wavelengths of light emitted from the LEDs.

Exemplary embodiments of the present disclosure provide a light emitting device allowing formation of electrodes without affecting light emitting regions of LEDs, and an LED display apparatus including the same.

Exemplary embodiments of the present disclosure provide a light emitting device having a novel structure allowing easy repair, and an LED display apparatus including the same.

In some forms, the present disclosure provide a display apparatus including a display substrate, and light emitting devices arranged on an upper surface of the display substrate. At least one of the light emitting devices includes a first LED unit including a first light emitting stack, a second LED unit including a second light emitting stack, and a third LED unit including a third light emitting stack. The second LED unit is disposed between the first LED unit and the third LED unit. Each of the first to third light emitting stacks includes a first conductivity type semiconductor layer and a second conductivity type semiconductor layer. The first conductivity type semiconductor layer and the second conductivity type semiconductor layer in each of the first to third light emitting stacks are stacked in a horizontal direction with respect to the upper surface of the display substrate, and at least one of the second conductivity type semiconductor layers in the first to third light emitting stacks is divided into two regions.

In other forms, the present disclosure provide a display apparatus including: a display substrate; and light emitting devices arranged on an upper surface of the display substrate. At least one of the light emitting devices includes a first LED unit including a first light emitting stack, a second LED unit including a second light emitting stack, a third LED unit including a third light emitting stack, a first bonding layer coupling the first LED unit to the second LED unit and a second bonding layer coupling the second LED unit to the third LED unit. The first to third LED units are coupled to one another in a horizontal direction with respect to the upper surface of the display substrate.

In another form, the present disclosure provide a light emitting device including: a first LED unit including a first light emitting stack, a second LED unit including a second light emitting stack, and a third LED unit including a third light emitting stack. The light emitting device further includes a first bonding layer coupling the first LED unit to the second LED unit, a second bonding layer coupling the second LED unit to the third LED unit, a first electrode electrically connected to the first LED unit, a second electrode electrically connected to the second LED unit, a third electrode electrically connected to the third LED unit, and a common electrode electrically connected to the first to third LED units. The second electrode is electrically connected to the second LED unit on one side surface of the second LED unit.

DETAILED DESCRIPTION OF EMBODIMENTS

Figure 1:
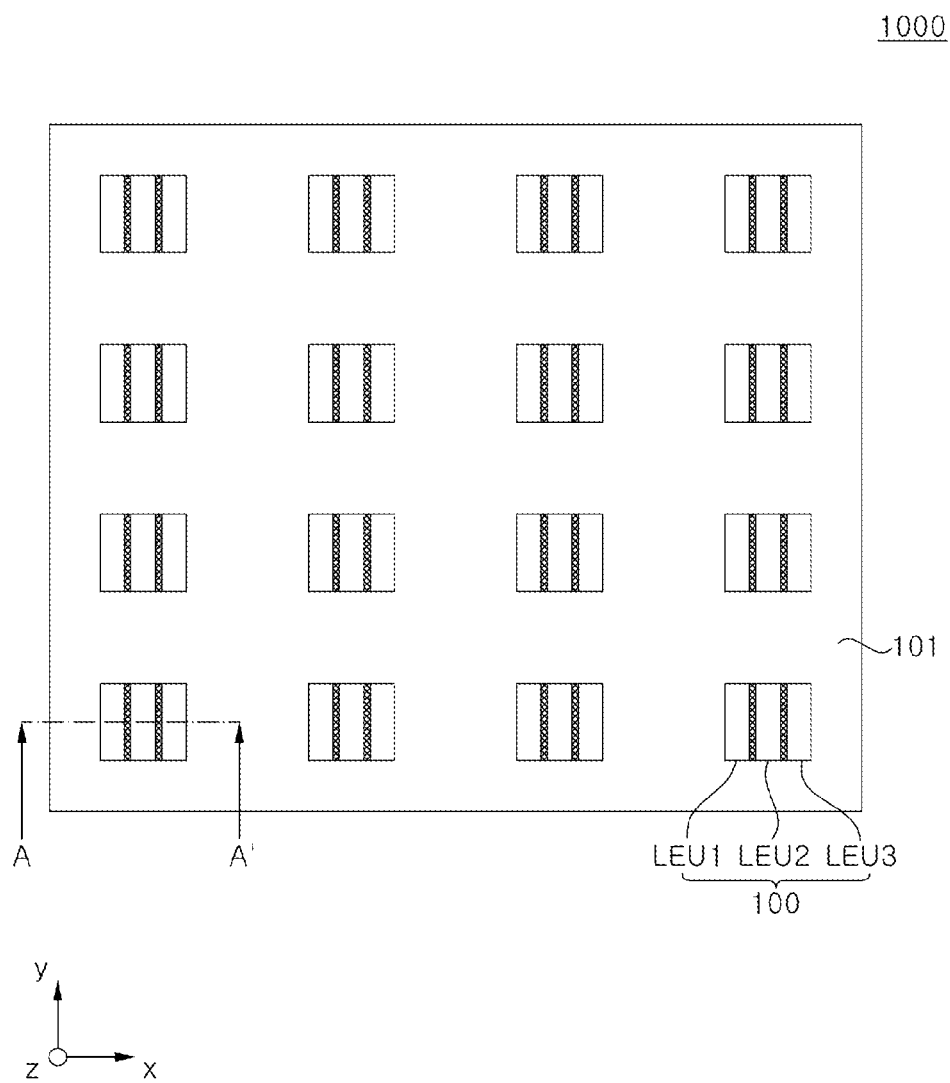
FIG. 1 is a schematic plan view of an LED display apparatus according to one or more exemplary embodiments of the present disclosure.

Hereinafter, exemplary embodiments of the present disclosure will be described in detail with reference to the accompanying drawings. The following embodiments are provided by way of example so as to fully convey the spirit of the present disclosure to those skilled in the art. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or component is referred to as being "disposed above" or "disposed on" another element or component, it can be directly "disposed above" or "disposed on" the other element or component or intervening elements or components can be present. Throughout the specification, like reference numerals denote like elements having the same or similar functions.

In some forms, exemplary embodiments of the present disclosure provide a display apparatus. The display apparatus includes a display substrate, and light emitting devices arranged on an upper surface of the display substrate. At least one of the light emitting devices includes a first LED unit including a first light emitting stack, a second LED unit including a second light emitting stack, and a third LED unit including a third light emitting stack. The second LED unit is disposed between the first LED unit and the third LED unit. Each of the first to third light emitting stacks includes a first conductivity type semiconductor layer and a second conductivity type semiconductor layer, the first conductivity type semiconductor layer and the second conductivity type semiconductor layer in each of the first to third light emitting stacks are stacked in a horizontal direction with respect to the upper surface of the display substrate, and at least one of the second conductivity type semiconductor layers in the first to third light emitting stacks is divided into two regions.

Since the semiconductor layers are stacked in the horizontal direction with respect to the upper surface of the display substrate, light emitted from the semiconductor layers may be discharged without passing through other light emitting stacks. As a result, the stacking sequence of the first to third light emitting stacks is not restricted by the wavelength of light emitted therefrom.

Further, since the second conductivity type semiconductor layer is divided into at least two regions, one of the two regions may be used as a spare region, thereby allowing easy repair of the light emitting devices.

Each of the first to third light emitting stacks may further include an active layer interposed between the first conductivity type semiconductor layer and the second conductivity type semiconductor layer, and the active layer interposed between the second conductivity type semiconductor layer divided into the at least two regions and the first conductivity type semiconductor layer may be divided together with the second conductivity type semiconductor layer.

In at least one variant, one of the first to third LED units may emit red light, another LED unit may emit green light, and the remaining LED unit may emit blue light.

In another variant, the second LED unit may emit red light. In a typical stack structure, since blue light or green light is absorbed by a light emitting stack adapted to emit red light, a second LED unit emitting red light is not disposed between the first LED unit and the third LED unit, which emit light having a shorter wavelength than the light emitted from the second LED unit. However, according to this embodiment, since the light emitted from the second LED unit may be discharged without passing through the first LED unit and the third LED unit, the second LED unit may be configured to emit red light.

In yet another variant, the at least one light emitting device may include electrodes electrically connected to the first to third LED units, respectively, and the electrodes may include electrodes electrically connected to the divided regions of the second conductivity type semiconductor layer, respectively.

In yet another variant, the at least one light emitting device may further include a common electrode commonly electrically connected to the first to third LED units.

The electrodes and the common electrode may be disposed between the at least one light emitting device and the display substrate.

The light emitting device may further include an insulating layer having openings, and the electrodes may be disposed on the insulating layer and may be electrically connected to the first to third LED units through the openings.

The display apparatus may further include multiple module substrates disposed between the display substrate and the light emitting devices, and the light emitting devices may be disposed on the module substrates.

The display apparatus may further include drivers disposed on back surfaces of the module substrates.

In another variant, the module substrates may include connectors formed in through-holes of the module substrates and electrically connecting the light emitting devices to the drivers.

In another variant, each of the module substrates may include connectors formed on a side surface of the module substrate and electrically connecting the light emitting devices to the drivers.

In yet another variant, the light emitting devices may be spaced apart from one another by a black material. Accordingly, contrast ratios of the light emitting devices can be improved.

In other forms, exemplary embodiments of the present disclosure provide a display apparatus. The display apparatus includes a display substrate, and light emitting devices arranged on an upper surface of the display substrate. At least one of the light emitting devices includes a first LED unit including a first light emitting stack, a second LED unit including a second light emitting stack, a third LED unit including a third light emitting stack, a first bonding layer coupling the first LED unit to the second LED unit; and a second bonding layer coupling the second LED unit to the third LED unit. The first to third LED units are coupled to one another in a horizontal direction with respect to the upper surface of the display substrate and at least one of the first to third LED units includes light emitting regions divided from each other.

In yet another variant, the first bonding layer or the second bonding layer may be formed of an opaque material.

In another form, exemplary embodiments of the present disclosure provide a light emitting device. The light emitting device includes a first LED unit including a first light emitting stack, a second LED unit including a second light emitting stack, and a third LED unit including a third light emitting stack. The second LED unit is disposed between the first LED unit and the third LED unit. Each of the first to third light emitting stacks includes a first conductivity type semiconductor layer and a second conductivity type semiconductor layer. At least one of the second conductivity type semiconductor layers in the first to third light emitting stacks is divided into at least two regions.

The light emitting device may further include electrodes individually electrically connected to the first to third LED units and a common electrode commonly electrically connected to the first to third LED units. The electrodes may include individual electrodes electrically connected to the each of divided regions of the second conductivity type semiconductor layer, respectively.

In at least one variant, the electrodes and the common electrode may be disposed on the same side surface of the light emitting device.

The first LED unit may further include a first reflective layer disposed on the first light emitting stack, the second LED unit may further include a second reflective layer disposed on the second light emitting stack, and the third LED unit may further include a third reflective layer disposed on the third light emitting stack.

Each of the first to third LED units may further include contact electrodes forming ohmic contact with the second conductivity type semiconductor layers of the first to third light emitting stacks, and the contact electrodes may include contact electrodes forming ohmic contact with the divided regions of the second conductivity type semiconductor layer, respectively.

Hereinafter, exemplary embodiments of the present disclosure will be described in detail with reference to the accompanying drawings.

Figure 2:
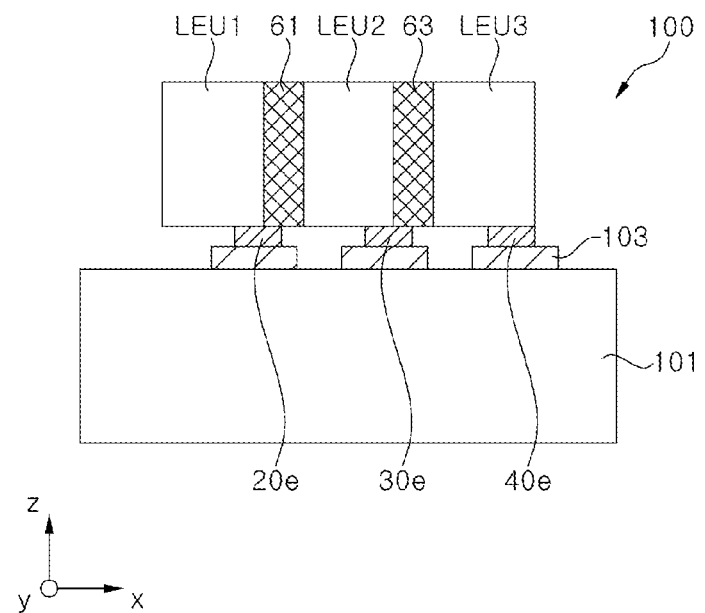
FIG. 2 is a schematic cross-sectional view taken along line A-A' of FIG. 1.
Figure 3:
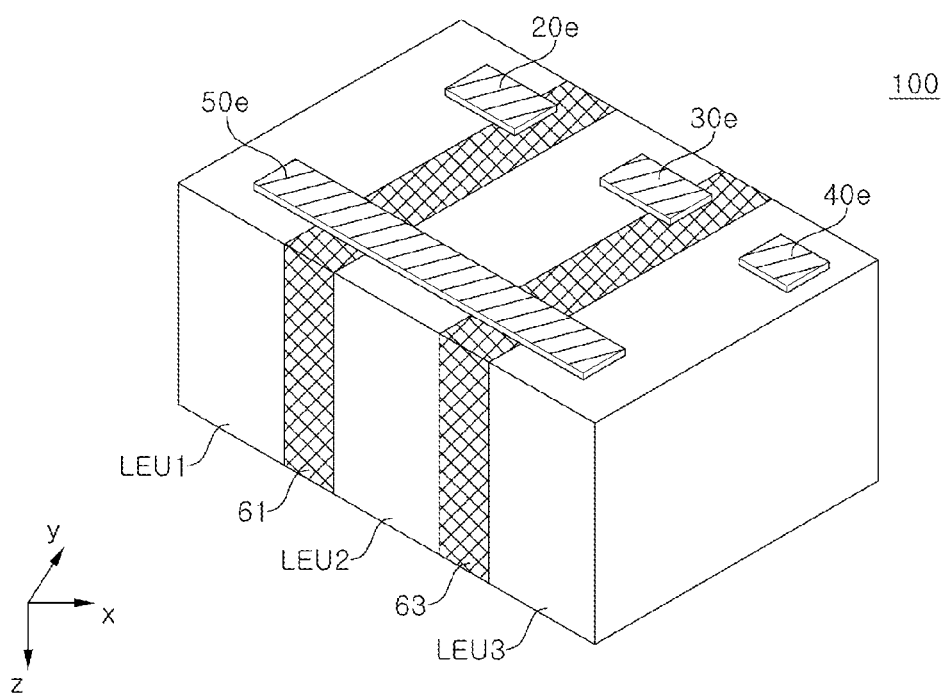
FIG. 3 is a schematic perspective view of a light emitting device according to one or more exemplary embodiments of the present disclosure.

FIG. 1 is a schematic plan view of an LED display apparatus 1000 according to one or more exemplary embodiments of the present disclosure, FIG. 2 is a schematic cross-sectional view taken along line A-A' of FIG. 1, and FIG. 3 is a schematic perspective view of a light emitting device according to one or more exemplary embodiments of the present disclosure.

Referring to FIG. 1, FIG. 2, and FIG. 3, the LED display apparatus 1000 includes a display substrate 101, and multiple light emitting devices 100. The LED display apparatus 1000 may be so-called a micro-LED display apparatus, in which one subpixel has a light emitting area of 10,000 µm$^2$ or less, specifically 4,000 µm$^2$ or less, more specifically 1,000 µm$^2$ or less.

The display substrate 101 may include circuits connected to the light emitting devices 100. As shown in FIG. 2, connection pads 103 may be exposed on the display substrate 101 and the light emitting devices 100 may be connected to the connection pads 103.

The light emitting devices 100 may be aligned on the display substrate 101. As shown in FIG. 1, the light emitting devices 100 may be aligned in a matrix on the display substrate 101 and each of the light emitting devices 100 may constitute one pixel.

The light emitting device 100 may include a first LED unit LEU1, a second LED unit LEU2, a third LED unit LEU3, and bonding layers 61, 63 as shown in FIG. 2. In addition, as shown in FIG. 3, the light emitting device 100 may include first to third electrodes 20e, 30e, 40e and a common electrode 50e.

The first LED unit LEU1 may emit a first color of light, the second LED unit LEU2 may emit a second color of light, and the third LED unit LEU3 may emit a third color of light. The first to third colors of light may be red light, green light and blue light, respectively, without being limited thereto. Alternatively, the first color of light may be green light, the second color of light may be red light, and the third color of light may be blue light. In a typical stack type light emitting device, the stacking sequence is restricted by the wavelength of light emitted from the light emitting device, whereas the wavelength of light emitted from the light emitting device according to this embodiment does not restrict the stacking sequence of the LED units LEU1, LEU2, LEU3. For convenience of description, unless stated otherwise, the first LED unit LEU1, the second LED unit LEU2, and the third LED unit LEU3 will be described as emitting red light, green light, and blue light, respectively.

Each of the first to third LED units LEU1, LEU2, LEU3 may include a first conductivity type semiconductor layer, an active layer, and a second conductivity type semiconductor layer. These layers are disposed perpendicular to an upper surface of the display substrate 101. That is, in the typical stack type light emitting device, the semiconductor layers are stacked in a perpendicular direction (z-direction) corresponding to a direction in which light is emitted from an upper surface of display substrate, whereas, in the light emitting device according to this embodiment, the semiconductor layers are stacked in a horizontal direction (x-direction) with respect to the upper surface of the display substrate. The light is emitted in the z-direction and the x-direction is generally perpendicular to the z-direction. The first conductivity type semiconductor layer, the active layer, and the second conductivity type semiconductor layer will be described below in detail with reference to FIG. 4.

The first bonding layer 61 is disposed between the first LED unit LEU1 and the second LED unit LEU2 to couple the first LED unit LEU1 to the second LED unit LEU2. The second bonding layer 63 is disposed between the second LED unit LEU2 and the third LED unit LEU3 to couple the second LED unit LEU2 to the third LED unit LEU3. That is, the first, second and third LED units LEU1, LEU2, LEU3 are coupled to one another, side by side, by the first and second bonding layers 61, 63 to constitute one light emitting device 100. The one light emitting device 100 includes the first to third LED units LEU1, LEU2, LEU3 to emit at least first to third colors of light, thereby providing one pixel.

The first and second bonding layers 61, 63 may include a non-conductive material. The first and second bonding layers 61, 63 may include an optically clear adhesive (OCA), for example, an epoxy, a polyimide resin, SU8, spin-on-glass (SOG), and benzocyclobutene (BCB), without being limited thereto. In addition, according to this embodiment, since the first and second bonding layers 61, 63 are not required to allow light generated from the first to third LED units LEU1, LEU2, LEU3 to pass therethrough, the first and second bonding layers 61, 63 may be formed of an opaque material. For example, the first and second bonding layers 61, 63 may include a light absorption material or a light reflection material.

The first electrode 20e, the second electrode 30e, the third electrode 40e, and the common electrode 50e may be formed to allow independent operation of the first to third LED units LEU1, LEU2, LEU3. In one embodiment, the first electrode 20e may be electrically connected to an anode of the first LED unit LEU1, the second electrode 30e may be electrically connected to an anode of the second LED unit LEU2, and the third electrode 40e may be electrically connected to an anode of the third LED unit LEU3. The common electrode 50e may be commonly electrically connected to cathodes of the first, second and third LED units LEU1, LEU2, LEU3. In another embodiment, the first to third electrodes 20e, 30e, 40e may be electrically connected to cathodes of the first to third LED units LEU1, LEU2, LEU3, respectively, and the common electrode 50e may be commonly electrically connected to anodes of the first, second, and third LED units LEU1, LEU2, LEU3.

As shown in FIG. 3, the first electrode 20e may be electrically connected to the first LED unit LEU1 at one side of the first LED unit LEU1. The second electrode 30e may be electrically connected to the second LED unit LEU2 at one side of the second LED unit LEU2 and the third electrode 40e may be electrically connected to the third LED unit LEU3 at one side of the third LED unit LEU3. On the other hand, the common electrode 50e may be disposed across side surfaces of the first to third LED units LEU1, LEU2, LEU3 and may be electrically connected thereto. In order to increase the area of the first electrode 20e, a portion of the first electrode 20e may be disposed on the first bonding layer 61, as shown in FIG. 3. In order to increase the area of the second electrode 30e, a portion of the second electrode 30e may be disposed on the second bonding layer 63, as shown in FIG. 3.

The electrodes 20e, 30e, 40e, 50e are not limited to a particular shape and may have various shapes, for example, a rectangular shape, a circular shape, or a polygonal shape. In addition, before formation of the electrodes 20e, 30e, 40e, 50e, an insulating layer may be formed to partially expose the first to third LED units LEU1, LEU2, LEU3. The electrodes 20e, 30e, 40e, 50e may be electrically connected to the exposed portion of the first to third LED units LEU1, LEU2, LEU3 through the insulating layer.

The first, second and third electrodes 20e, 30e, 40e and the common electrode 50e may be bonded to the connection pads 103 on the display substrate 101 as shown in FIG. 2. Accordingly, the first, second and third electrodes 20e, 30e, 40e and the common electrode 50e may be disposed between the light emitting device 100 and the display substrate 101, and the first to third LED units LEU1, LEU2, LEU3 may emit light upwards through surfaces thereof opposite to the first to third electrodes 20e, 30e, 40e.

According to this embodiment, the first LED unit LEU1, the second LED unit LEU2, and the third LED unit LEU3 are coupled to one another, side by side, in the horizontal direction on the upper surface of the display substrate 101. Accordingly, since light emitted from each of the first to third LED units LEU1, LEU2, LEU3 does not interfere with light emitted from the other LED units, the stacking sequence of these LED units may be changed as needed. Furthermore, the first to third LED units LEU1, LEU2, LEU3 closely contact one another, thereby enabling easy mixing of the colors of light emitted therefrom and free adjustment of the size of the pixel through minimization of the area of the display substrate 101 occupied by the light emitting device 100.

The light emitting device 100 may be provided from a light emitting stack structure formed by stacking the first to third LED units LEU1, LEU2, LEU3. Hereinafter, various light emitting stack structures will be described with reference to FIG. 4 to FIG. 7.

Figure 4:
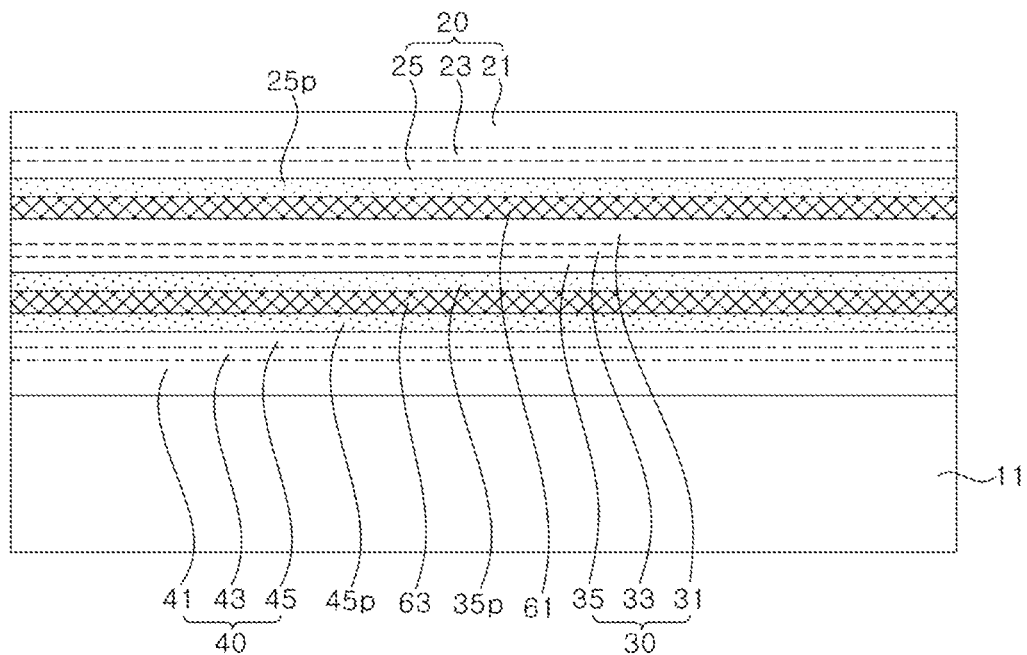
FIG. 4 is a schematic sectional view of another light emitting stack structure for manufacturing another light emitting device according to one or more exemplary embodiments of the present disclosure.

FIG. 4 is a schematic sectional view of a light emitting stack structure for manufacturing a light emitting device according to one or more exemplary embodiments of the present disclosure.

Referring to FIG. 4, the light emitting stack structure according to the exemplary embodiment includes a substrate 11, a first light emitting stack 20, a second light emitting stack 30, and a third light emitting stack 40. The first light emitting stack 20 includes a first conductivity type semiconductor layer 21, an active layer 23, and a second conductivity type semiconductor layer 25; the second light emitting stack 30 includes a first conductivity type semiconductor layer 31, an active layer 33, and a second conductivity type semiconductor layer 35, and the third light emitting stack 40 includes a first conductivity type semiconductor layer 41, an active layer 43, and a second conductivity type semiconductor layer 45. Further, contact electrodes 25p, 35p, 45p may be disposed on the second conductivity type semiconductor layers 25, 35, 45 of the light emitting stacks 20, 30, 40, respectively.

The substrate 11 may be a growth substrate, for example, a sapphire substrate, which allows epitaxial growth of the third light emitting stack 40 thereon. It should be understood that the substrate 11 is not limited to the sapphire substrate and may include various other transparent insulating materials. For example, the substrate 11 may include glass, quartz, silicon, organic polymers or an organic-inorganic composite material, for example, silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate 11 may include roughness formed on an upper surface thereof and may be, for example, a patterned sapphire substrate. The third light emitting stack 40 may have roughness on a lower surface thereof, which adjoins the substrate 11 having roughness formed on the upper surface thereof, thereby improving efficiency in extraction of light generated in the third light emitting stack 40. The substrate 11 may be removed in the course of manufacturing the light emitting device 100, without being limited thereto. Alternatively, the substrate may remain thereon.

The first light emitting stack 20 may include semiconductor materials, such as AlGaAs, GaAsP, AlGaInP, and GaP, which emit red light, without being limited thereto.

According to one embodiment, the second light emitting stack 30 may include a semiconductor material, such as GaN, InGaN, GaP, AlGaInP, AlGaP, and the like, which emit green light, without being limited thereto. The second contact electrode 35p is disposed on the second conductivity type semiconductor layer 35 of the second light emitting stack 30.

According to one embodiment, the third light emitting stack 40 may include a semiconductor material, such as GaN, InGaN, ZnSe, and the like, which emit blue light, without being limited thereto. The third contact electrode 45p is disposed on the second conductivity type semiconductor layer 45 of the third light emitting stack 40 as shown in FIG. 4.

Each of the first conductivity type semiconductor layers 21, 31, 41 and the second conductivity type semiconductor layers 25, 35, 45 of the first, second and third light emitting stacks 20, 30, 40 may have a single layer or multilayer structure. In some embodiments, each of the first and second conductivity type semiconductor layers may include a superlattice layer. Furthermore, the active layers 23, 33, 43 of the first, second and third light emitting stacks 20, 30, 40 may have a single layer or multilayer structure.

The first conductivity type semiconductor layers 21, 31, 41 of each of the light emitting stacks may be n-type semiconductor layers and the second conductivity type semiconductor layers 25, 35, 45 may be p-type semiconductor layers. In this case, the third light emitting stack 40 may have an opposite stacking sequence to the first light emitting stack 20 and the second light emitting stack 30. As a result, the p-type semiconductor layer 45 may be disposed on the active layer 43, thereby simplifying a manufacturing process. Furthermore, the n-type semiconductor layer and the p-type semiconductor layer may be interchanged.

The first, second and third contact electrodes 25p, 35p, 45p may be formed of any materials capable of forming ohmic contact with the second conductivity type semiconductor layers 25, 35, 45, without limitation. Each of the first, second and third contact electrodes 25p, 35p, 45p may include a transparent conductive material that transmits light, without being limited thereto. For example, the contact electrodes 25p, 35p, 45p may include a transparent conductive oxide (TCO), for example, SnO, InO2, ZnO, ITO, ITZO, and the like.

The first bonding layer 61 is disposed between the first light emitting stack 20 and the second light emitting stack 30, and the second bonding layer 63 is disposed between the second light emitting stack 30 and the third light emitting stack 40. Since materials of the first and second bonding layers 61, 63 are similar to the materials described above, detailed description thereof will be omitted.

In the third light emitting stack 40, the first conductivity type semiconductor layer 41, the active layer 43 and the second conductivity type semiconductor layer 45 may be sequentially grown on the substrate 11 by, for example, metal organic chemical vapor deposition (MOCVD) or molecular beam epitaxy (MBE). The third contact electrode 45p may be formed on the second conductivity type semiconductor layer 45 by, for example, physical vapor deposition or chemical vapor deposition, and may include a transparent conductive oxide (TCO), for example, SnO, $InO_2$, ZnO, ITO, ITZO, and the like, or an ohmic metal layer.

For the third light emitting stack 40 emitting blue light, the substrate 11 includes $Al_2O_3$ (for example: a sapphire substrate) and the third contact electrode 45p may include Ni/Au or a transparent conductive oxide (TCO), such as SnO, $InO_2$, ZnO, ITO, ITZO, and the like. Each of the first and second light emitting stacks 20, 30 may be similarly formed by sequentially growing a first conductivity type semiconductor layer, an active layer, and a second conductivity type semiconductor layer on a temporary substrate. The contact electrode may be formed on each of the second conductivity type semiconductor layers by, for example, plating, physical vapor deposition, or chemical vapor deposition.

In one embodiment, the first light emitting stack 20 may be attached to the second light emitting stack 30 through the first bonding layer 61 and the second light emitting stack 30 may be attached to the third light emitting stack 40 through the second bonding layer 63. For example, after the third light emitting stack 40 is grown on the substrate 11, the second light emitting stack 30 grown on the temporary substrate may be attached to the third light emitting stack 40 through the second bonding layer 63. Thereafter, the temporary substrate is removed from the second light emitting stack 30. Next, the first light emitting stack 20 grown on another temporary substrate may be attached to the second light emitting stack 30 through the first bonding layer 61. Thereafter, the temporary substrate is removed from the first light emitting stack 20.

In another embodiment, the first and second light emitting stacks 20, 30 may be coupled to each other via the first bonding layer 61 interposed therebetween, and at least one of the temporary substrates of the first and second light emitting stacks 20, 30 may be removed by a laser lift-off process, a chemical process, a mechanical process, and the like. In addition, the first and second light emitting stacks 20, 30 may be coupled to the third light emitting stack 40 via the second bonding layer 63 interposed therebetween, and the remaining temporary substrate of the first and second light emitting stacks 20, 30 may be removed by a laser lift-off process, a chemical process, a mechanical process, and the like.

The light emitting device 100 as shown in FIG. 3 may be realized by patterning the light emitting stack structure according to this embodiment and forming the first to third electrodes 20e, 30e, 40e and the common electrode 50e on the side surfaces of the first to third light emitting stacks 20, 30, 40. The first LED unit LEU1 described above includes the first light emitting stack 20 and the first contact electrode 25p, the second LED unit LEU2 includes the second light emitting stack 30 and the second contact electrode 35p, and the third LED unit LEU3 includes the third light emitting stack 40 and the third contact electrode 45p.

Such light emitting devices 100 are arranged individually or as a group on the display substrate 101, thereby realizing the display apparatus 1000. The first to third electrodes 20e, 30e, 40e and the common electrode 50e formed on the light emitting device 100 may be bonded to the connection pads 103 on the display substrate 101.

In this embodiment, the light emitting stack structure includes three light emitting stacks 20, 30, 40. However, it should be understood that the present disclosure is not limited to a particular number of light emitting stacks. For example, in some embodiments, the light emitting stack structure may include two or more light emitting stacks. As such, the light emitting device 100 may include three light emitting stacks 20, 30, 40, without being limited thereto. Alternatively, the light emitting device 100 may include two light emitting stacks or four or more light emitting stacks.

Figure 5:
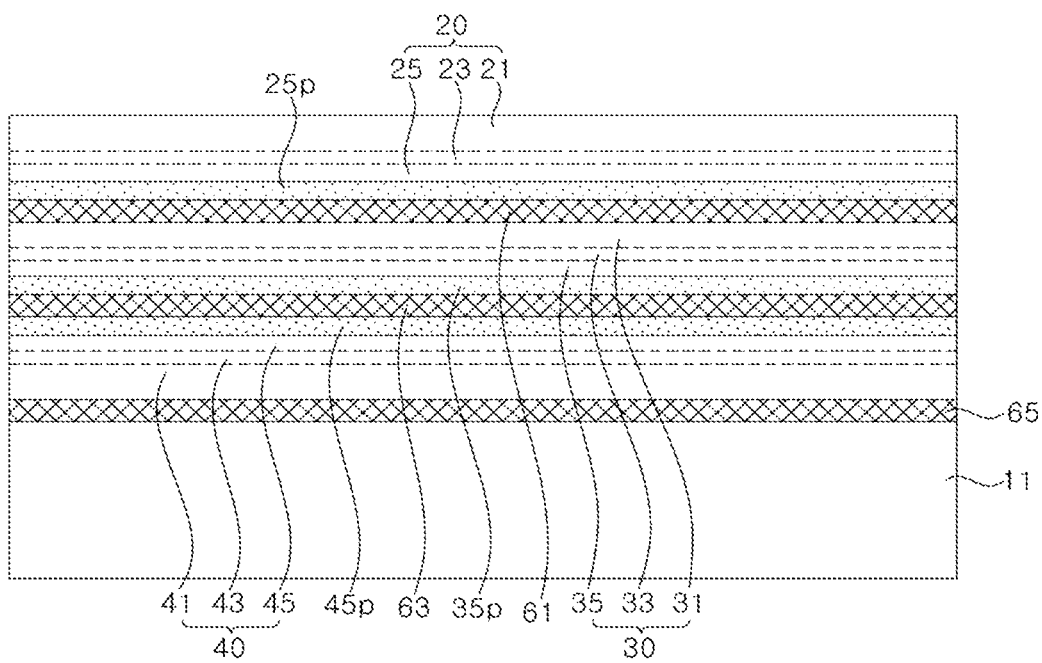
FIG. 5 is a schematic sectional view of yet another light emitting stack structure for manufacturing another light emitting device according to one or more exemplary embodiments of the present disclosure.

FIG. 5 is a schematic sectional view of a light emitting stack structure for manufacturing a light emitting device according to one or more exemplary embodiments of the present disclosure.

Referring to FIG. 5, the light emitting stack structure according to this embodiment is generally similar to the light emitting stack structure described with reference to FIG. 4 except that a third bonding layer 65 is interposed between the substrate 11 and the third light emitting stack 40.

According to this embodiment, the substrate 11 is a support substrate for supporting the first to third light emitting stacks 20, 30, 40 and is not necessarily a growth substrate for growth of the third light emitting stack 40. The substrate 11 may be a sapphire substrate, without being limited thereto. Alternatively, the substrate 11 may include a black material capable of absorbing light, for example, a black epoxy or black silicone, or a light reflective material, for example, a white epoxy. The substrate 11 may be directly coupled to the third light emitting stack 40 or may be coupled thereto by the third bonding layer 65. The substrate 11 may be separated from the third light emitting stack 40 to provide the light emitting device 100, without being limited thereto. Alternatively, the substrate 11 may remain in a state of being attached to the third light emitting stack 40.

Figure 6:
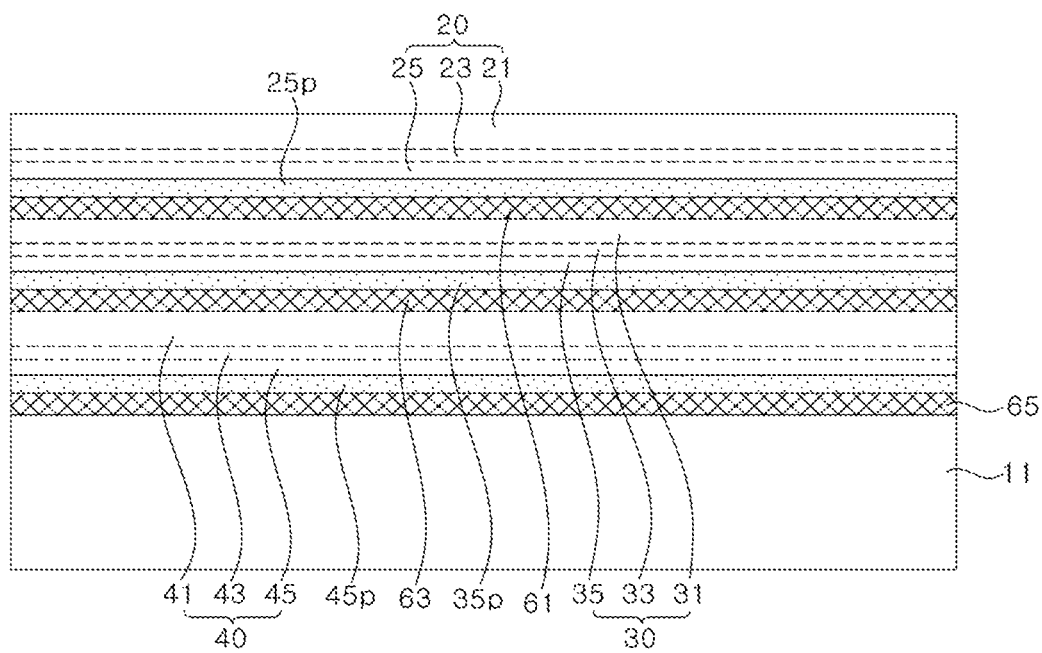
FIG. 6 is a schematic sectional view of yet another light emitting stack structure for manufacturing a light emitting device according to one or more exemplary embodiments of the present disclosure.

FIG. 6 is a schematic sectional view of a light emitting stack structure for manufacturing a light emitting device according to another embodiment of the present disclosure.

Referring to FIG. 6, the light emitting stack structure according to this embodiment is generally similar to the light emitting stack structure described with reference to FIG. 5 except that the first conductivity type semiconductor layer 41 of the third light emitting stack 40 is substituted with the second conductivity type semiconductor layer 45 and the third contact electrode 45p is interposed between the third bonding layer 65 and the second conductivity type semiconductor layer 45.

Figure 7:
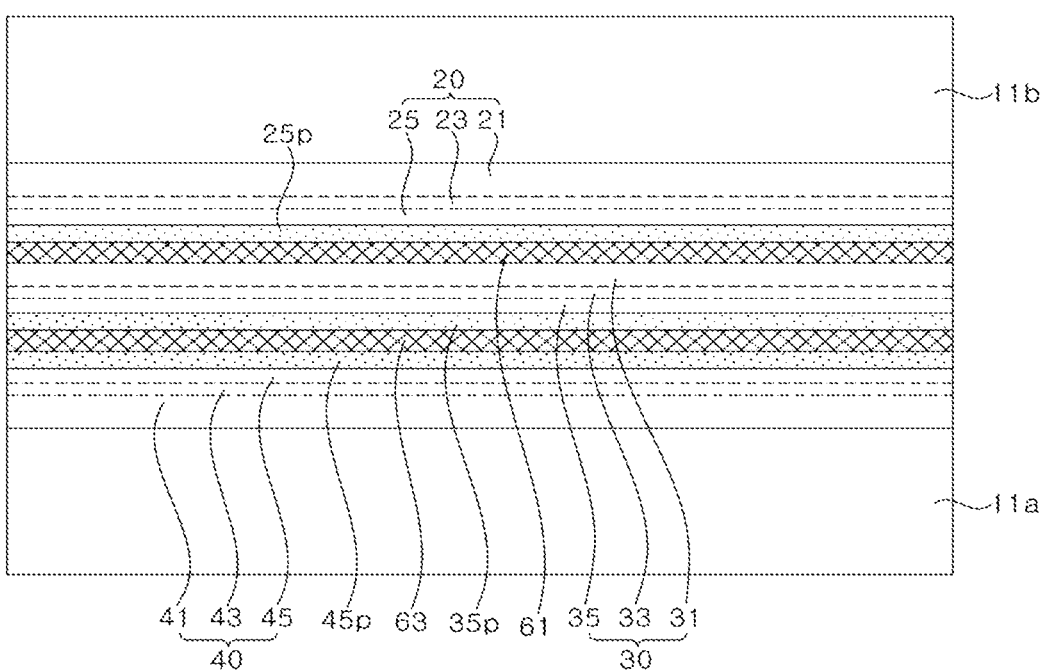
FIG. 7 is a schematic sectional view of further another light emitting stack structure for manufacturing a light emitting device according to one or more exemplary embodiments of the present disclosure.

FIG. 7 is a schematic sectional view of a light emitting stack structure for manufacturing a light emitting device according to further another embodiment of the present disclosure.

Referring to FIG. 7, the light emitting stack structure according to this embodiment is generally similar to the light emitting stack structure described with reference to FIG. 4 except that substrates 11a, 11b are disposed at opposite sides of the first to third light emitting stack structures 20, 30, 40.

The substrate 11a may be a growth substrate for growth of the third light emitting stack 40, without being limited thereto. In addition, as described with reference to FIG. 5 or FIG. 6, the substrate 11a may be attached to the third light emitting stack 40 through the third bonding layer 65 or may be directly attached thereto without the third bonding layer 65.

The substrate 11b may be a growth substrate for growth of the first light emitting stack 20, without being limited thereto. The substrate 11b may be attached to the first light emitting stack 20 through a bonding layer or may be directly attached thereto. The sequence of the first to third light emitting stacks 20, 30, 40 interposed between the substrate 11a and the substrate 11b is not particularly limited.

In one embodiment, the substrate 11b may be a growth substrate for growth of the first light emitting stack 20; the first light emitting stack 20 may emit green light; the second light emitting stack 30 may emit red light; and the third light emitting stack 40 may emit blue light. In this embodiment, both the substrate 11a and the substrate 11b may be sapphire substrates. In another embodiment, the substrate 11a and the substrate 11b may include a black material capable of absorbing light, for example, a black epoxy or black silicone.

Figure 8:
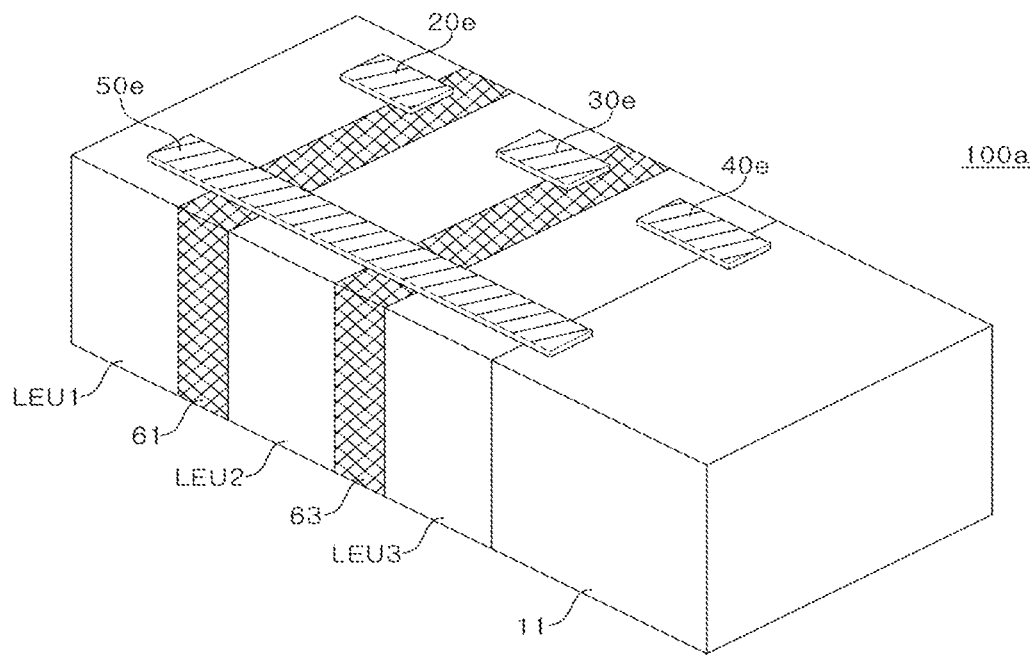
FIG. 8 is a schematic perspective view of another light emitting device according to one or more exemplary embodiments of the present disclosure.

FIG. 8 is a schematic perspective view of a light emitting device 100a according to one or more embodiments of the present disclosure.

Referring to FIG. 8, the light emitting device 100a is generally similar to the light emitting device 100 and further includes the substrate 11. That is, the light emitting device 100a may be manufactured by dividing the light emitting stacks 20, 30, 40 without removing the substrate 11 from the light emitting stack structure of FIG. 4. According to this embodiment, a portion of the third electrode 40e may be disposed on the substrate 11, thereby enabling formation of the third electrode 40e.

Figure 9:
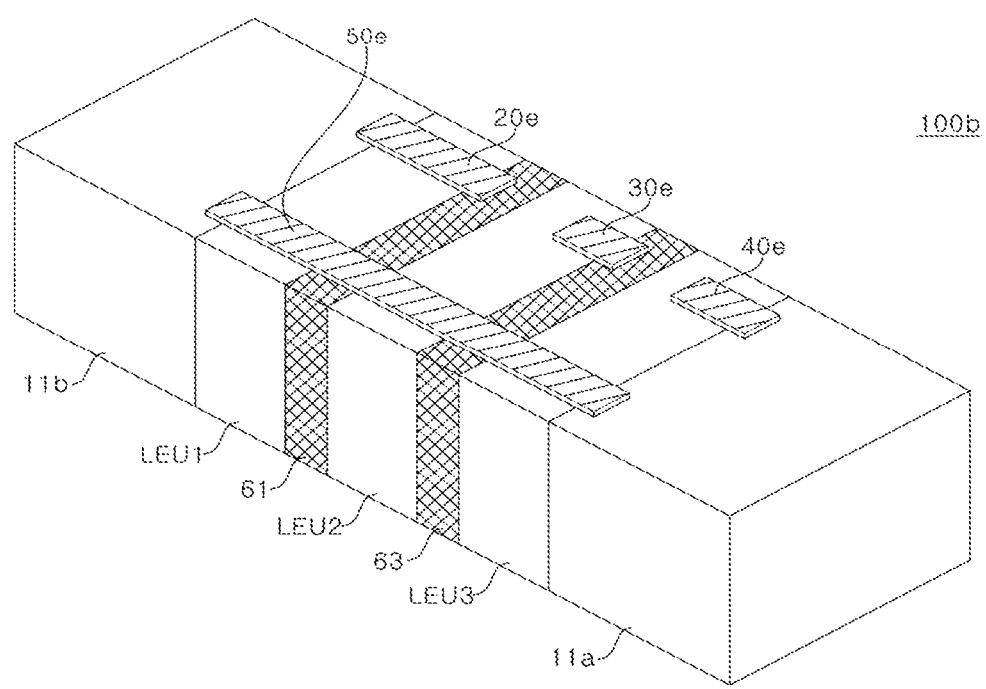
FIG. 9 is a schematic perspective view of yet another light emitting device according to one or more exemplary embodiments of the present disclosure.

FIG. 9 is a schematic perspective view of another light emitting device 100b according to one or more embodiments of the present disclosure.

Referring to FIG. 9, the light emitting device 100b according to this embodiment may be manufactured by dividing the light emitting stacks 20, 30, 40 together with the substrates 11a, 11b without removing the substrates 11a, 11b from, for example, the light emitting stack structure of FIG. 7.

Here, the substrates 11a, 11b may be a transparent substrate, such as a sapphire substrate, without being limited thereto. Alternatively, the substrate 11a, 11b may include a black material capable of absorbing light, for example, a black epoxy or black silicone.

Figure 10:
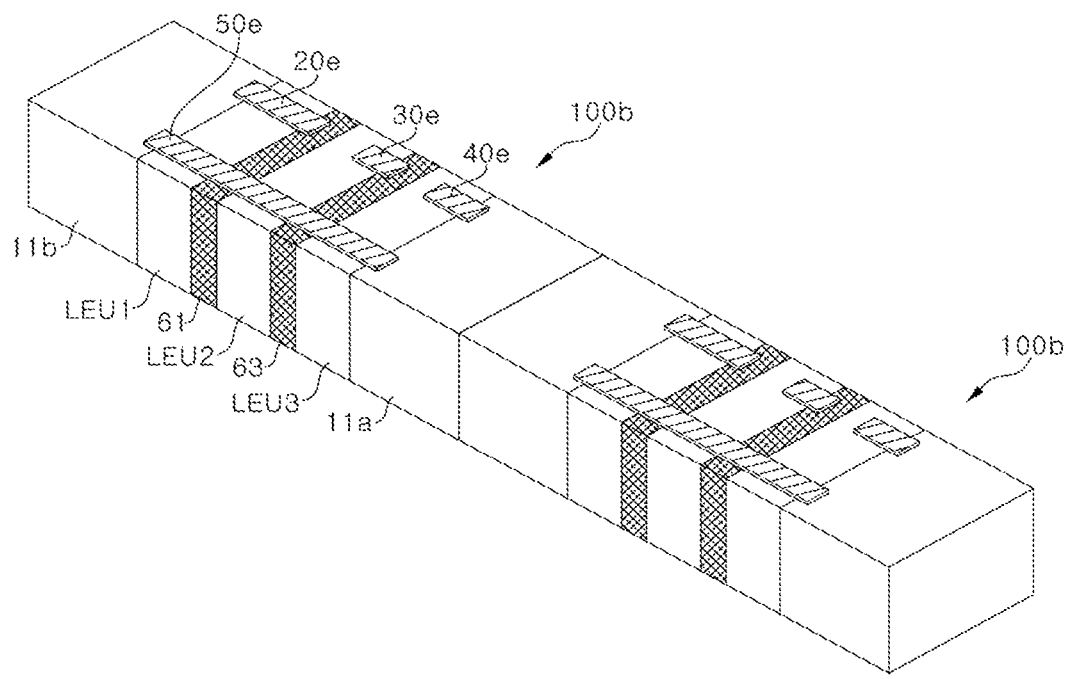
FIG. 10 is a schematic perspective view of further another light emitting device module according to one or more exemplary embodiments of the present disclosure.

FIG. 10 is a schematic perspective view of a light emitting device module according to one or more exemplary embodiments of the present disclosure.

Referring to FIG. 10, the light emitting device module according to this embodiment includes multiple light emitting devices 100b. The light emitting devices 100b of FIG. 9 are coupled to each other in the stacking sequence of the first to third light emitting units LEU1, LEU2, LEU3. That is, the substrates 11a, 11b of adjacent light emitting devices 100b may be coupled to each other.

At least two light emitting devices 100b may be coupled to each other in the stacking direction, thereby providing a column-shaped light emitting device module. The light emitting device module may be mounted on the display substrate 101, thereby further facilitating a mounting process. For the substrates 11a, 11b formed of a black material, it is possible to prevent interference of light between the light emitting devices 100b.

Although not shown in the drawings, an anti-reflection layer or an anti-scattering layer may be further formed on a light exit surface side of the light emitting device module. The anti-reflection layer or the anti-scattering layer may be formed of an organic material or an inorganic material of an oxide or a nitride, for example, $SiO_2$, $SiN_x$, $Al_2O_3$, or an epoxy.

Figure 11:
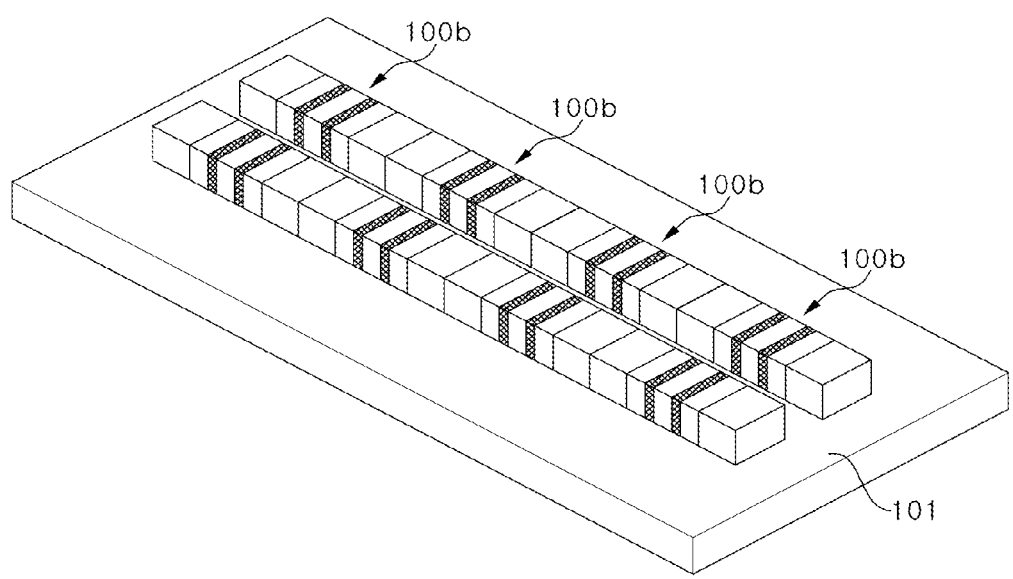
FIG. 11 is a schematic perspective view of another LED display apparatus according to one or more exemplary embodiments of the present disclosure.

FIG. 11 is a schematic perspective view of an LED display apparatus according to one or more exemplary embodiments of the present disclosure.

Referring to FIG. 11, the LED display apparatus according to this embodiment is manufactured by mounting the light emitting device module of FIG. 10 on the display substrate 101.

The display apparatus may be realized by preparing light emitting device modules including the multiple light emitting devices in the longitudinal direction, followed by arranging the light emitting device modules on the display substrate 101.

Figure 12:
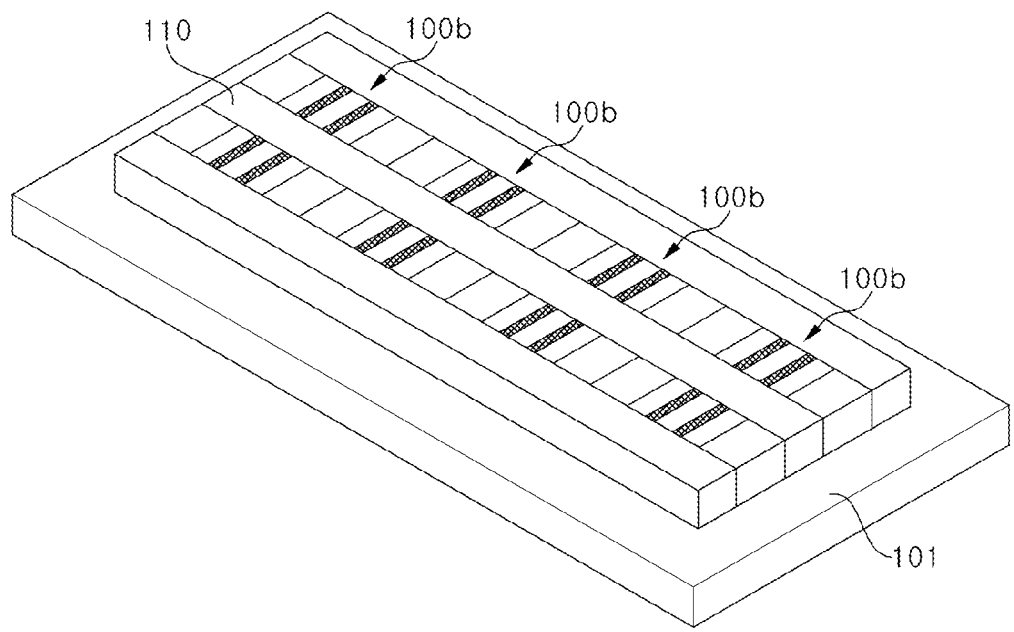
FIG. 12 is a schematic perspective view of yet another LED display apparatus according to one or more exemplary embodiments of the present disclosure.

FIG. 12 is a schematic perspective view of an LED display apparatus according to one or more exemplary embodiments of the present disclosure.

Referring to FIG. 12, the LED display apparatus according to this embodiment is generally similar to the LED display apparatus described with reference to FIG. 11 and further includes a light blocking material 110. The light blocking material 110 may cover both side surfaces of the column-shaped light emitting device module. For the LED display apparatus including multiple light emitting device modules, the light blocking material 110 fills a region between the light emitting device modules while covering outer side surfaces of the light emitting device modules.

The light blocking material 110 may be formed of, for example, a light absorption material, such as a black material, or a light reflective material, such as a white epoxy. As a result, it is possible to prevent interference of light between the light emitting device modules. The substrates 11a, 11b may be formed of a black material to prevent interference of light between the light emitting device modules, thereby improving contrast ratio between the pixels.

Figure 13:
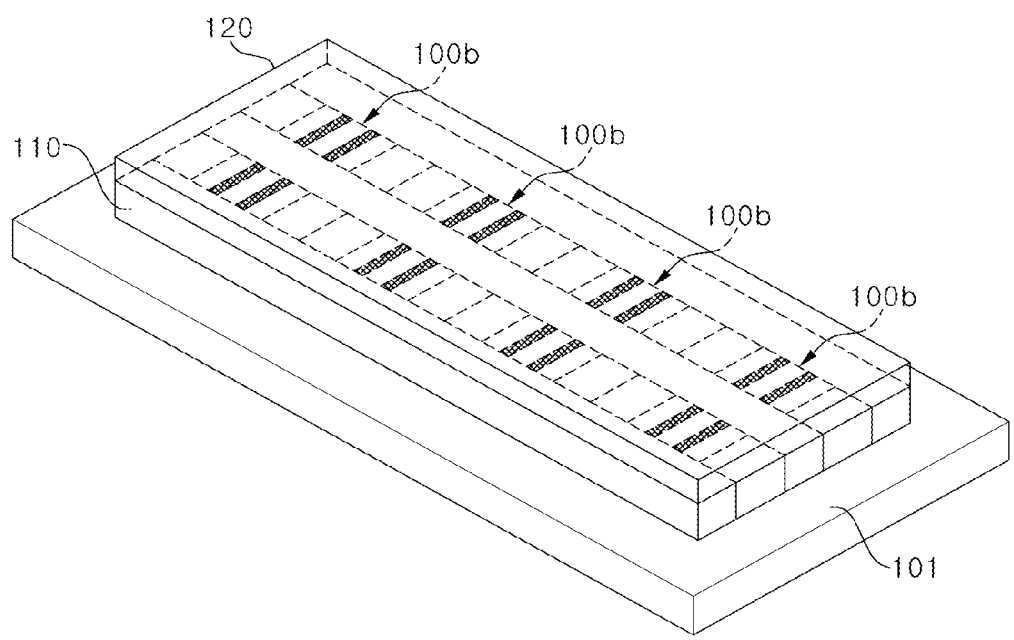
FIG. 13 is a schematic perspective view of further another LED display apparatus according to one or more exemplary embodiments of the present disclosure.

FIG. 13 is a schematic perspective view of an LED display apparatus according to one or more exemplary embodiments of the present disclosure.

Referring to FIG. 13, the LED display apparatus according to this embodiment is generally similar to the LED display apparatus described with reference to FIG. 12 and further includes a transparent layer 120 for reducing light scattering or light reflection, for example, an anti-scattering layer. The transparent layer 120 suppresses light interference between the pixels while reducing light scattering or light reflection.

Figure 14:
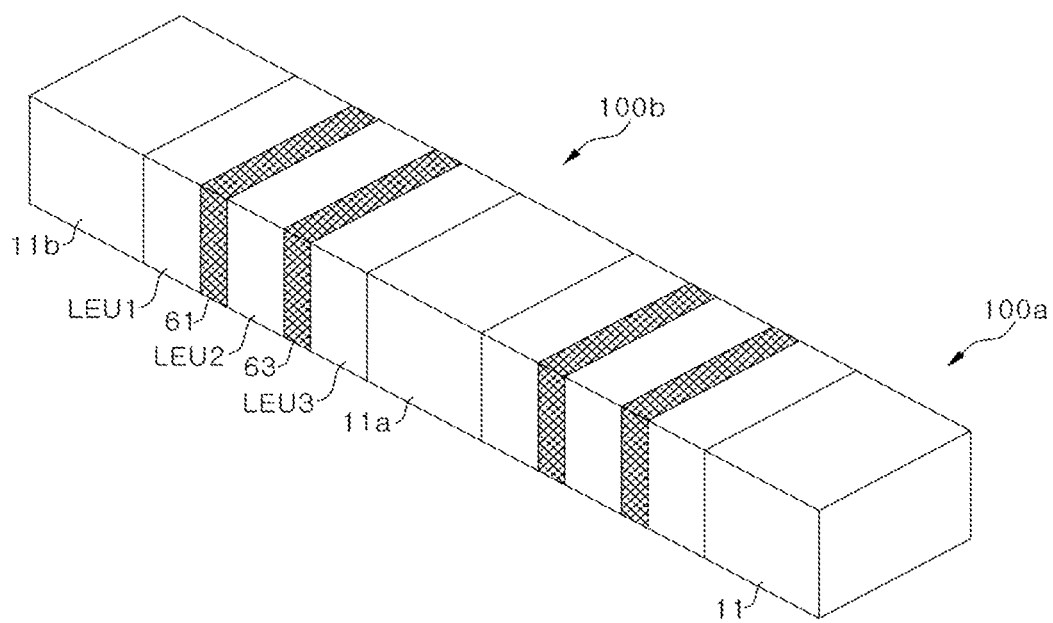
FIG. 14 is a schematic perspective view of a light emitting device module according to one or more exemplary embodiments of the present disclosure.

FIG. 14 is a schematic perspective view of a light emitting device module according to one or more exemplary embodiments of the present disclosure.

Referring to FIG. 14, the light emitting device module according to this embodiment is generally similar to the light emitting device module described with reference to FIG. 10 except that the substrate 11b is omitted in the region between the light emitting devices.

For example, the light emitting device module according to this embodiment may be realized by coupling the light emitting device 100a described with reference to FIG. 8 and the light emitting device 100b described with reference to FIG. 9.

According to this embodiment, the light emitting device module can further reduce a gap between the pixels, thereby achieving further reduction in distance between the light emitting devices.

Figure 15:
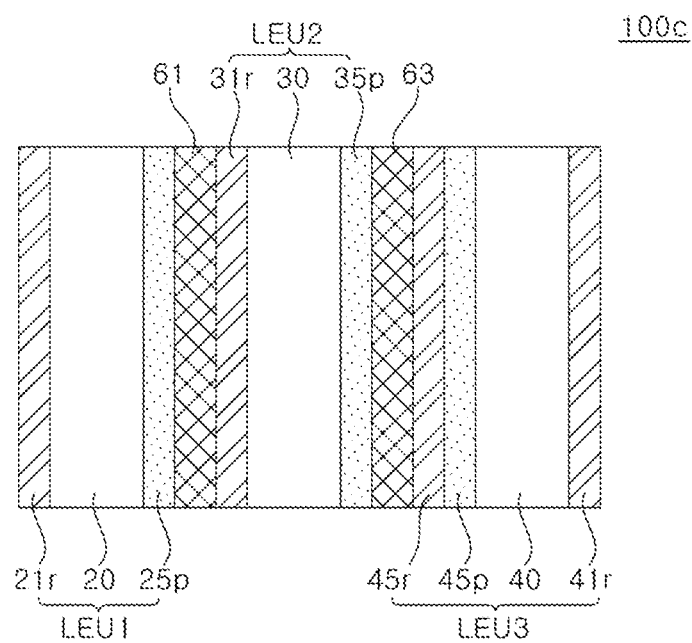
FIG. 15 is a schematic sectional view of a light emitting device according to one or more exemplary embodiments of the present disclosure.

FIG. 15 is a schematic sectional view of a light emitting device 100c according to one or more exemplary embodiments of the present disclosure.

Referring to FIG. 15, the light emitting device 100c according to this embodiment is generally similar to the light emitting device 100 described with reference to FIG. 1 to FIG. 3 and further includes reflective layers 21r, 31r, 41r, 45r.

The first LED unit LEU1 may include a first reflective layer 21r together with the first light emitting stack 20 and the contact electrode 25P. The first reflective layer 21r may be disposed at an opposite side of the contact electrode 25p. As shown in FIG. 4, the contact electrode 25p may form ohmic contact with the second conductivity type semiconductor layer 25 and the first reflective layer 21r may be formed on the first conductivity type semiconductor layer 21. The first reflective layer 21r may form ohmic contact with the first conductivity type semiconductor layer 21, without being limited thereto. That is, the first reflective layer 21r may form Schottky contact with the first conductivity type semiconductor layer 21 or may be insulated from the first conductivity type semiconductor layer 21. The first reflective layer 21r reflects light emitted from the first light emitting stack 20, thereby preventing light loss.

The second LED unit LEU2 may include a second reflective layer 31r together with the second light emitting stack 30 and the contact electrode 35p. The second reflective layer 31r may be disposed at an opposite side of the contact electrode 35p. As shown in FIG. 4, the contact electrode 35p may form ohmic contact with the second conductivity type semiconductor layer 35 and the second reflective layer 31r may be formed on the first conductivity type semiconductor layer 31. The first bonding layer 61 may couple the second reflective layer 31r to the contact electrode 25p. Further, the second reflective layer 31r may form ohmic contact with the first conductivity type semiconductor layer 31, without being limited thereto. That is, the second reflective layer 31r may form Schottky contact with the first conductivity type semiconductor layer 31 or may be insulated from the first conductivity type semiconductor layer 31. The second reflective layer 31r may reflect light emitted from the second light emitting stack 30. Furthermore, the second reflective layer 31r may reflect light emitted from the first light emitting stack 20.

The third LED unit LEU3 may include a third reflective layer 41r and a fourth reflective layer 45r together with the third light emitting stack 40 and the contact electrode 45P. The third reflective layer 41r may be disposed at an opposite side of the contact electrode 45P. As shown in FIG. 4, the contact electrode 45P may form ohmic contact with the second conductivity type semiconductor layer 45 and the third reflective layer 41r may be formed at one side of the first conductivity type semiconductor layer 41. The third reflective layer 41r may form ohmic contact with the first conductivity type semiconductor layer 41, without being limited thereto. That is, the third reflective layer 41r may form Schottky contact with the first conductivity type semiconductor layer 41 or may be insulated from the first conductivity type semiconductor layer 41.

The fourth reflective layer 45r may be formed on the contact electrode 45P. The second bonding layer 63 may couple the fourth reflective layer 45r to the contact electrode 35p.

The third and fourth reflective layers 41r, 45r reduce light loss by reflecting light emitted from the third light emitting stack 40. In addition, the fourth reflective layer 45r may reflect light emitted from the second light emitting stack 30.

According to this embodiment, light emitted from the first light emitting stack 20 may be reflected by the first reflective layer 21r and the second reflective layer 31r. Accordingly, it is possible to reduce light loss by preventing light from being discharged from the first light emitting stack 20 in an undesired direction using the first reflective layer 21r and the second reflective layer 31r.

Light emitted from the second light emitting stack 30 may be reflected by the second reflective layer 31r and the fourth reflective layer 45r. Accordingly, it is possible to reduce light loss by preventing light from being discharged from the second light emitting stack 30 in an undesired direction using the second reflective layer 31r and the fourth reflective layer 45r.

Light emitted from the third light emitting stack 40 may be reflected by the third reflective layer 41r and the fourth reflective layer 45r. Accordingly, it is possible to reduce light loss by preventing light from being discharged from the third light emitting stack 40 in an undesired direction using the third reflective layer 41r and the fourth reflective layer 45r.

The first to fourth reflective layers 21r, 31r, 41r, 45r may be metal reflective layers, without being limited thereto. For example, the first to fourth reflective layers 21r, 31r, 41r, 45r may be insulating reflective layers, such as distributed Bragg reflectors (DBR). For the DBRs, the first to fourth reflective layers may be formed as multi-wavelength reflectors adapted to reflect light in the overall wavelength band including blue, green and red wavelengths, in which the multi-wavelength reflectors may be narrow-band reflectors capable of selectively reflecting the corresponding wavelength bands depending on the location of each of the reflective layers. In this case, the first to fourth reflective layers 21r, 31r, 41r, 45r may be formed to different optical thicknesses or formed of different materials for high refractivity material layers and low refractivity material layers in order to reflect light in a desired wavelength band. For example, the first reflective layer 21r may selectively reflect red light, the third reflective layer 41r may selectively reflect blue light, and the second reflective layer 31r and the fourth reflective layer 45r may selectively reflect light in a relatively broad wavelength band, for example, in the overall wavelength band of the visible spectrum.

Figure 16:
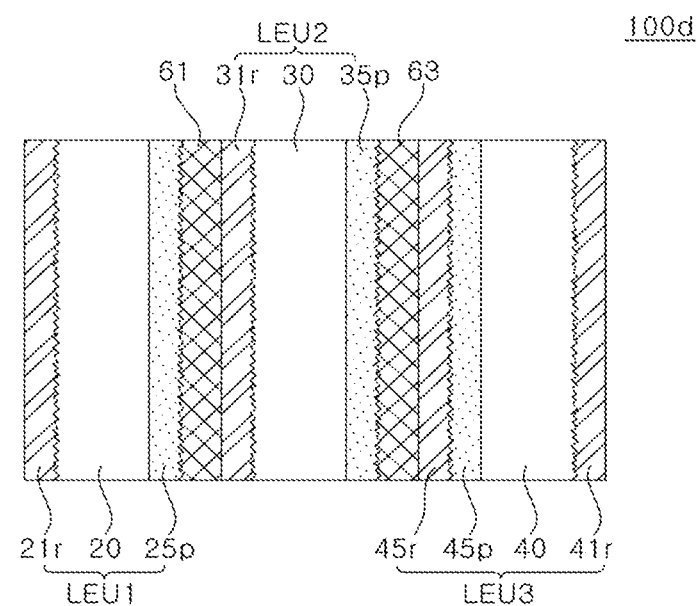
FIG. 16 is a schematic sectional view of another light emitting device according to one or more exemplary embodiments of the present disclosure.

FIG. 16 is a schematic sectional view of a light emitting device 100d according to one or more exemplary embodiments of the present disclosure.

Referring to FIG. 16, the light emitting device 100d according to this embodiment is generally similar to the light emitting device 100c described with reference to FIG. 15 except that the first to third light emitting stacks 20, 30, 40 and/or the contact electrodes 25p, 35p, 45p are formed with roughness for light scattering. The roughness may be formed on the first conductivity type semiconductor layers 21, 31, 41 or the second conductivity type semiconductor layers 25, 35, 45 of the first to third light emitting stacks 20, 30, 40 and may be formed on the contact electrodes 25p, 35p, 45p. The roughness may be formed by various methods such as deposition or etching techniques and may be formed regularly or irregularly. The roughness scatters light emitted from the light emitting stacks 20, 30, 40 and increases the quantity of light emitted from the light emitting stacks 20, 30, 40.

Figure 17:
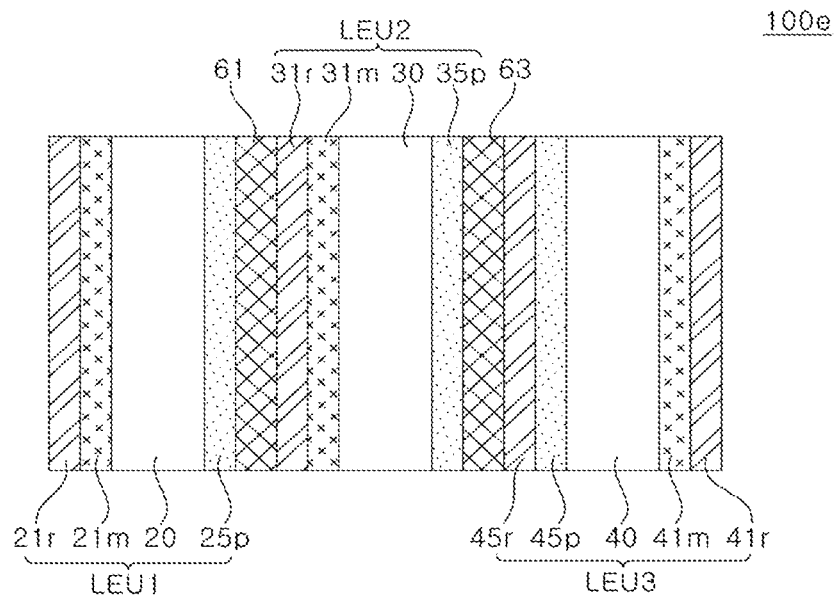
FIG. 17 is a schematic sectional view of yet another light emitting device according to one or more exemplary embodiments of the present disclosure.

FIG. 17 is a schematic sectional view of a light emitting device 100e according to one or more exemplary embodiments of the present disclosure.

Referring to FIG. 17, the light emitting device 100e according to this embodiment is generally similar to the light emitting device 100c described with reference to FIG. 15 and further includes ohmic electrodes 21m, 31m, 41m.

The first ohmic electrode 21m may be disposed between the first light emitting stack 20 and the first reflective layer 21r and forms ohmic contact with the first conductivity type semiconductor layer of the first light emitting stack 20. The second ohmic electrode 31m may be disposed between the second light emitting stack 30 and the second reflective layer 31r and forms ohmic contact with the first conductivity type semiconductor layer of the second light emitting stack 30. The third ohmic electrode 41m may be disposed between the third light emitting stack 40 and the third reflective layer 41r and forms ohmic contact with the first conductivity type semiconductor layer of the third light emitting stack 40.

The first, second and third ohmic electrodes 21m, 31m, 41m serve to achieve uniform distribution of electric current in the first to third light emitting stacks 20, 30, 40.

Figure 18:
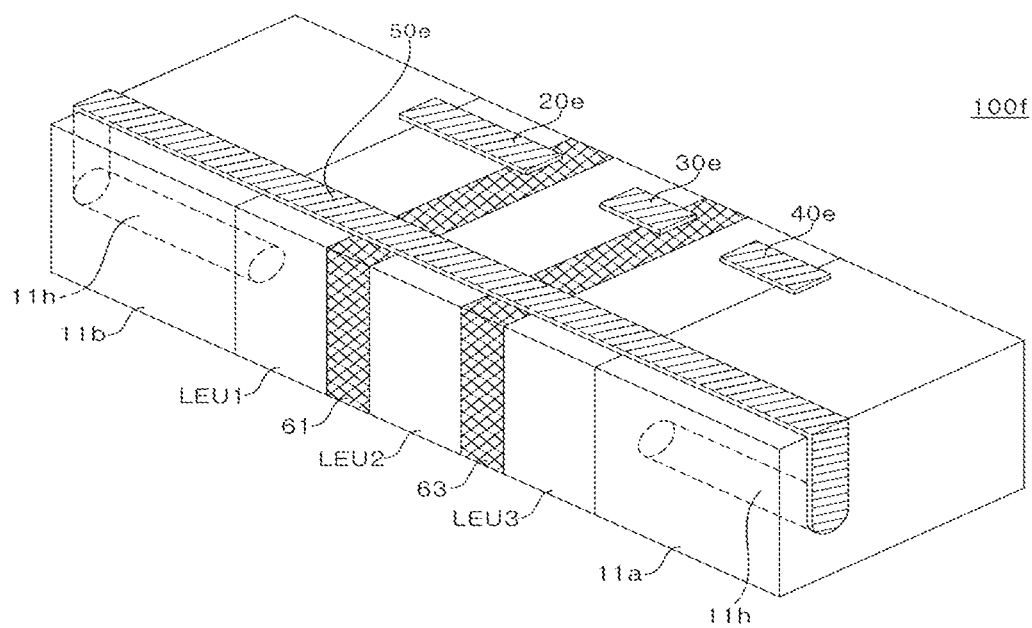
FIG. 18 is a schematic perspective view of another light emitting device according to one or more exemplary embodiments of the present disclosure.

FIG. 18 is a schematic perspective view of a light emitting device 100f according to one or more exemplary embodiments of the present disclosure.

Referring to FIG. 18, the light emitting device 100f according to this embodiment is generally similar to the light emitting device 100b described with reference to FIG. 9 except that the common electrode 50e is commonly connected to the first LED unit LEU1 and the third LED unit LEU3 through through-holes 11h formed through the substrates 11a, 11b.

The through-holes 11*h* may be formed through the substrates 11*a*, 11*b* and may be formed of a conductive material, for example, a metal or a semiconductor material. The common electrode 50*e* may be connected to the first LED unit LEU1 and the third LED unit LEU3 through the through-holes 11*h* instead of being connected thereto at the sides thereof. Here, the common electrode 50*e* may be connected to the second LED unit LEU2 at a side of the second LED unit LEU2.

Although the common electrode 50*e* is illustrated as being electrically connected to the first and third LED units LEU1, LEU3 through the through-holes 11*h* formed through the substrates 11*a*, 11*b* in this embodiment, the first electrode 20*e* and the third electrode 40*e* may be electrically connected to the first LED unit LEU1 and the second LED unit LEU2 through the through-holes 11*h*, respectively.

Figure 19:
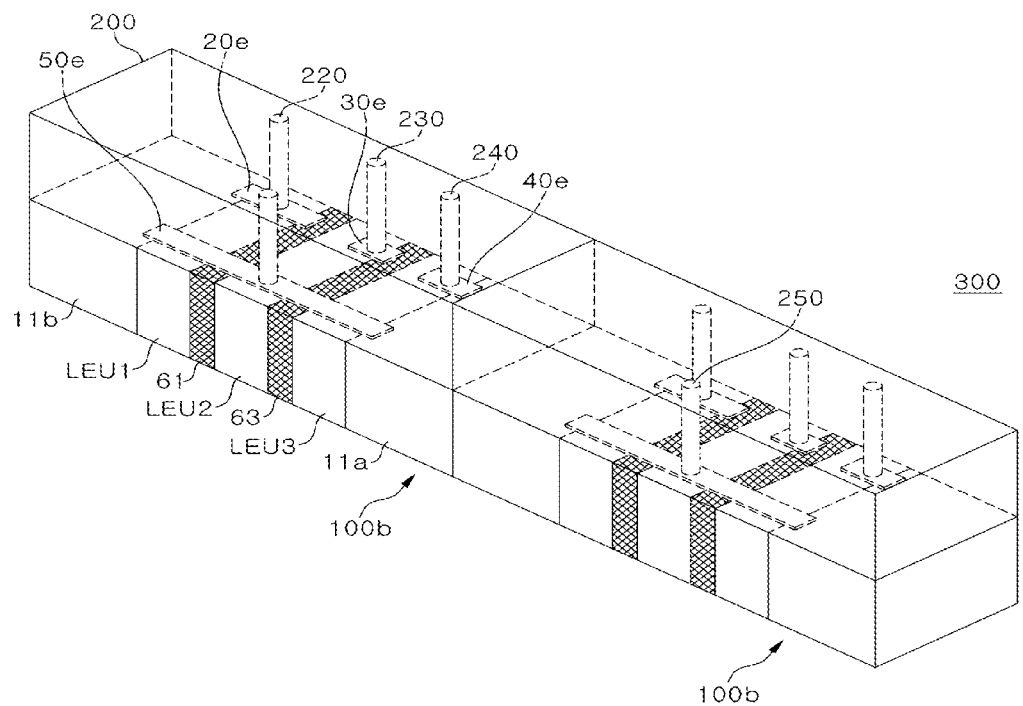
FIG. 19 is a schematic perspective view of further another light emitting device module according to one or more exemplary embodiments of the present disclosure.

FIG. 19 is a schematic perspective view of a light emitting device module 300 according to one or more exemplary embodiments of the present disclosure.

Referring to FIG. 19, the light emitting device module 300 according to this embodiment is generally similar to the light emitting device module described with reference to FIG. 10 or FIG. 11 and further includes a carrier substrate 200.

The carrier substrate 200 may include connectors 220, 230, 240, 250 connected to the electrodes 20*e*, 30*e*, 40*e*, 50*e* of the light emitting devices 100*b*. The carrier substrate 200 may be formed of the same material as the substrate for growth of semiconductor layers, such as a sapphire substrate or a GaAs substrate, without being limited thereto. For example, the carrier substrate 200 may be formed of an inorganic material, such as glass, or an organic material, such as an epoxy.

In this embodiment, the connectors 220, 230, 240, 250 may be formed by bonding the carrier substrate 200 to the light emitting devices 100*b*, followed by forming through-holes and filling the through-holes with a conductive material. Alternatively, the connectors 220, 230, 240, 250 may be previously formed on the carrier substrate 200, which in turn may be attached to the light emitting devices 100*b*.

In this embodiment, the connectors 220, 230, 240, 250 may be arranged at larger intervals than the electrodes 20*e*, 30*e*, 40*e*, 50*e*, whereby the carrier substrate 200 can act as an interposer.

Figure 20:
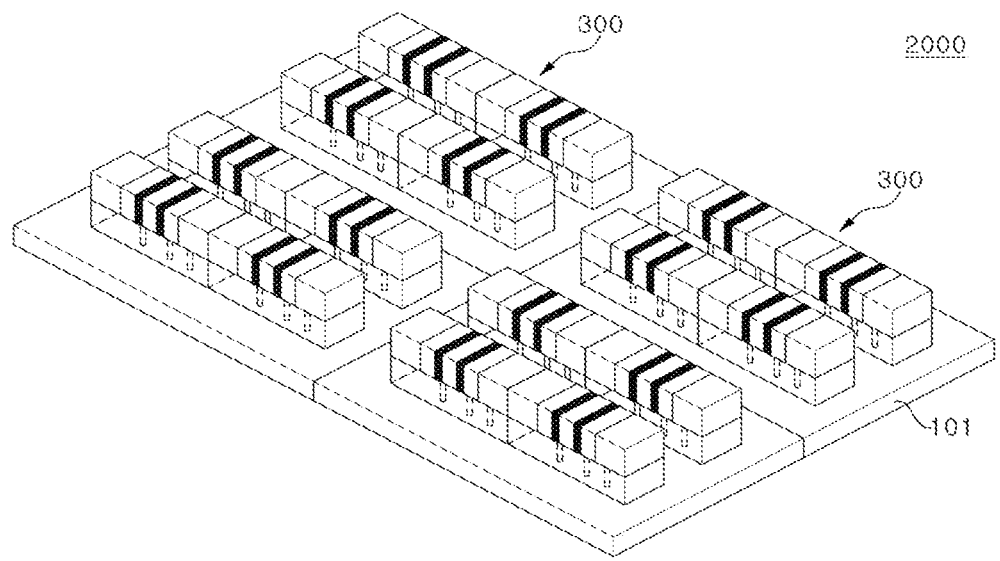
FIG. 20 is a schematic perspective view of yet another LED display apparatus according to one or more exemplary embodiments of the present disclosure.

FIG. 20 is a schematic perspective view of an LED display apparatus 2000 according to one or more exemplary embodiments of the present disclosure.

Referring to FIG. 20, the LED display apparatus 2000 according to this embodiment includes a display substrate 101 and multiple light emitting device modules 300.

The light emitting device module 300 is the same as the light emitting device module described with reference to FIG. 19 and detailed description thereof will be omitted to avoid repetition.

The multiple light emitting device modules 300 may be disposed on the display substrate 101, thereby realizing the LED display apparatus. Furthermore, a large LED display apparatus 2000 may be realized by arranging multiple circuit boards 101 having the light emitting device modules 300 arranged thereon.

According to this embodiment, the light emitting devices 100*b* may be mounted on the display substrate 101 using the carrier substrate 200, thereby facilitating the mounting process.

Figure 21:
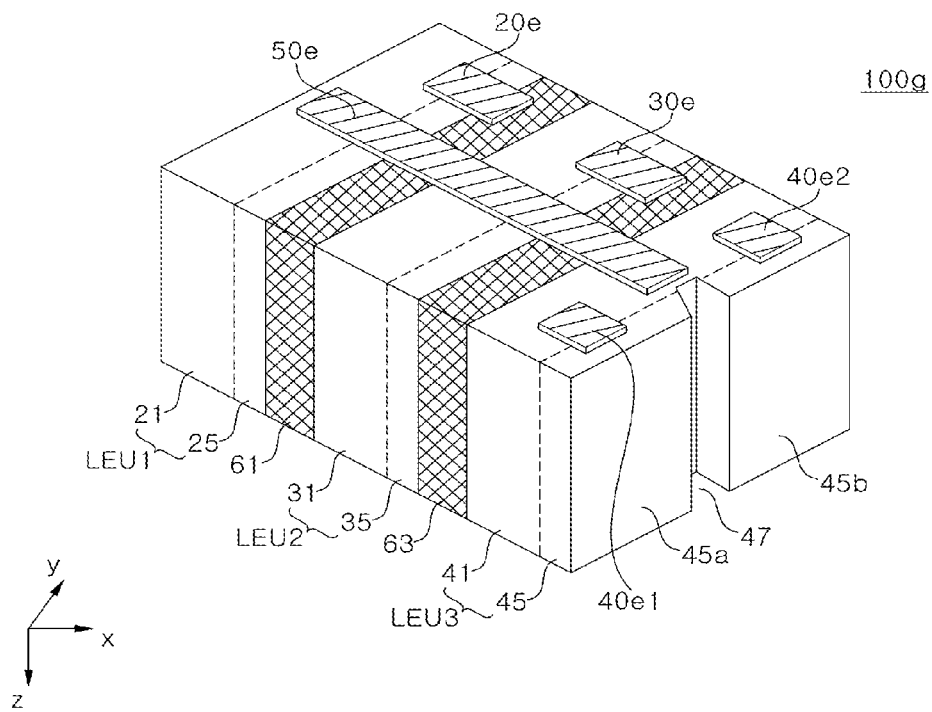
FIG. 21 is a schematic perspective view of yet another light emitting device according to one or more exemplary embodiments of the present disclosure.

FIG. 21 is a schematic perspective view of a light emitting device 100*g* according to one or more exemplary embodiments of the present disclosure.

Referring to FIG. 21, the light emitting device 100*g* according to this embodiment is generally similar to the light emitting device 100 described with reference to FIG. 1, FIG. 2, and FIG. 3 except that the second conductivity type semiconductor layer 45 of the third LED unit LEU3 is divided into two regions 45*a*, 45*b*.

That is, the second conductivity type semiconductor layer 45 may be divided into two regions 45*a*, 45*b* by mesa etching. A groove 47 may be formed between the two regions 45*a*, 45*b* by mesa etching. In some embodiments, the groove 47 may be filled with an insulating material. Although the second conductivity type semiconductor layer 45 is placed farther from the first conductivity type semiconductor layer 41 than from the second bonding layer 63 in this embodiment, the second conductivity type semiconductor layer 45 may be placed closer to the second bonding layer 63 than the first conductivity type semiconductor layer 41 in other embodiments.

In addition, although the active layers are not shown for simplification of the drawings, the active layers 23, 33, 43 are disposed between the first conductivity type semiconductor layers 21, 31, 41 and the second conductivity type semiconductor layers 25, 35, 45, as described in the above embodiments. Furthermore, the active layer 43 may be divided into two regions together with the second conductivity type semiconductor layer 45.

Further, as described in the above embodiments, the contact electrodes 25*p*, 35*p*, 45*p* may be formed on the second conductivity type semiconductor layers 25, 35, 45 and the reflective layers 21*r*, 31*r*, 41*r*, 45*r* may also be disposed thereon. Since the second conductivity type semiconductor layer 45 is divided into the two regions 45*a*, 45*b*, the contact electrodes 45*p* formed thereon may also be divided into two regions.

As described in the above embodiments, the first and second electrodes 20*e*, 30*e* are electrically connected to the second conductivity type semiconductor layer 25 of the first LED unit LEU1 and the second conductivity type semiconductor layer 35 of the second LED unit LEU2. The common electrode 50*e* is commonly electrically connected to the first conductivity type semiconductor layers 21, 31, 41. On the other hand, third electrodes 40*e*1, 40*e*2 are electrically connected to the divided two regions 45*a*, 45*b* of the second conductivity type semiconductor layer 45.

As the third electrodes 40*e*1, 40*e*2 are electrically connected to the two regions 45*a*, 45*b*, one of the third electrodes 40*e*1, 40*e*2 may be selected to contribute to emission of light from one of the two regions 45*a*, 45*b* and the other region may be used as a spare region.

For example, the third electrode 40*e*1 may be first selected to allow the third LED unit LEU3 to emit light. However, when n emission of light from the third LED unit LEU3 using the third electrode 40*e*1 and the region 45*a* may not work, the third electrode 40*e*2 may be selected to allow the third LED unit LEU3 to emit light. Accordingly, when there is failure in the light emitting device 100*g*, the light emitting device 100*g* may be repaired by changing a path for transfer of operation signals from the region 45*a* to the region 45*b* instead of replacing the entirety of the light emitting device 100*g* with another light emitting device.

Figure 22:
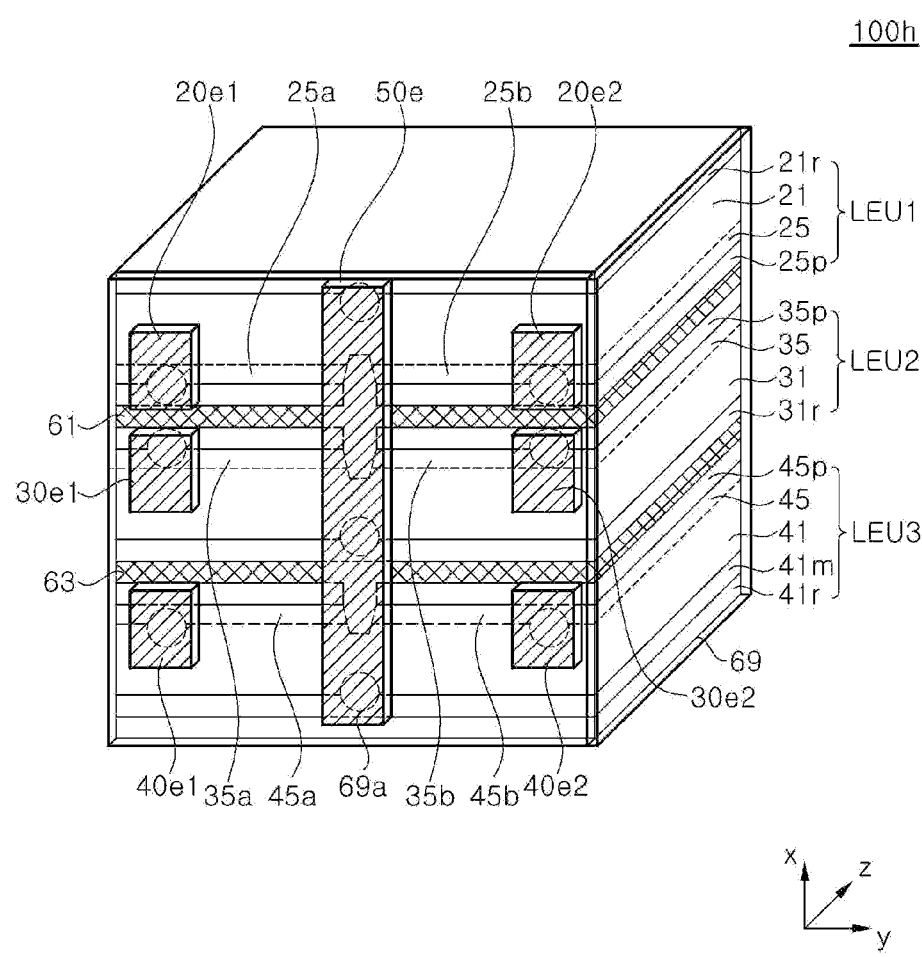
FIG. 22 is a schematic perspective view of yet another light emitting device according to one or more exemplary embodiments of the present disclosure.

FIG. 22 is a schematic perspective view of a light emitting device 100*h* according to one or more exemplary embodiments of the present disclosure.

Referring to FIG. 22, the light emitting device 100*h* according to this embodiment is generally similar to the light emitting device described with reference to FIG. 21 except that the second conductivity type semiconductor layer 25 of the first LED unit LEU1 and the second conductivity type semiconductor layer 35 of the second LED unit LEU2 are divided into regions 25a, 25b and regions 35a, 35b, respectively. Although the active layers are not shown for simplification of the drawings, the active layers 23, 33, 43 are disposed between the first conductivity type semiconductor layers 21, 31, 41 and the second conductivity type semiconductor layers 25, 35, 45, as described in the above embodiments. Similar to the active layer 43, the active layers 23 and 33 may be divided into two regions together with the second conductivity type semiconductor layers 25 and 35. Each of the contact electrode 25p and the contact electrode 35p may also be divided into at least two regions. Like the third electrodes 40e1, 40e2 electrically connected to the regions 45a, 45b, respectively, the first electrodes 20e1, 20e2 are electrically connected to the divided regions of the second conductivity type semiconductor layer 25, respectively, and the second electrodes 30e1, 30e2 are electrically connected to the divided regions of the second conductivity type semiconductor layer 35, respectively.

The reflective layers 21r, 31r, 41r may also be disposed to reflect light generated from the first to third LED units LEU1, LEU2, LEU3 and the contact electrodes 25p, 35p, 45p may be formed as reflective layers.

On the other hand, the electrodes 20e1, 20e2, 30e1, 30e2, 40e1, 40e2, 50e may be disposed on an insulating layer 69. The insulating layer 69 may include openings 69a that expose regions to which the electrodes 20e1, 20e2, 30e1, 30e2, 40e1, 40e250e are connected. In particular, the openings 69a may expose the first conductivity type semiconductor layers 21, 31, 41 and the second conductivity type semiconductor layers 25, 35, 45, and may expose the reflective layers 21r, 31r, 41r and/or the contact electrodes 25p, 35p, 45p electrically connected to these semiconductor layers.

Further, according to this embodiment, an ohmic layer 41m is disposed between the reflective layer 41r and the first conductivity type semiconductor layer 41. Alternatively, the reflective layer 41r may form direct ohmic contact with the first conductivity type semiconductor layer 41. Further, ohmic layers may be disposed between the reflective layer 21r and the first conductivity type semiconductor layer 21 or between the reflective layer 31r and the first conductivity type semiconductor layer 35, although not shown.

Although this embodiment is illustrated as having a particular stacking sequence of the first to third LED units LEU1, LEU2, LEU3, the stacking sequence can be changed and an additional reflective layer may be included therein.

Figure 23:
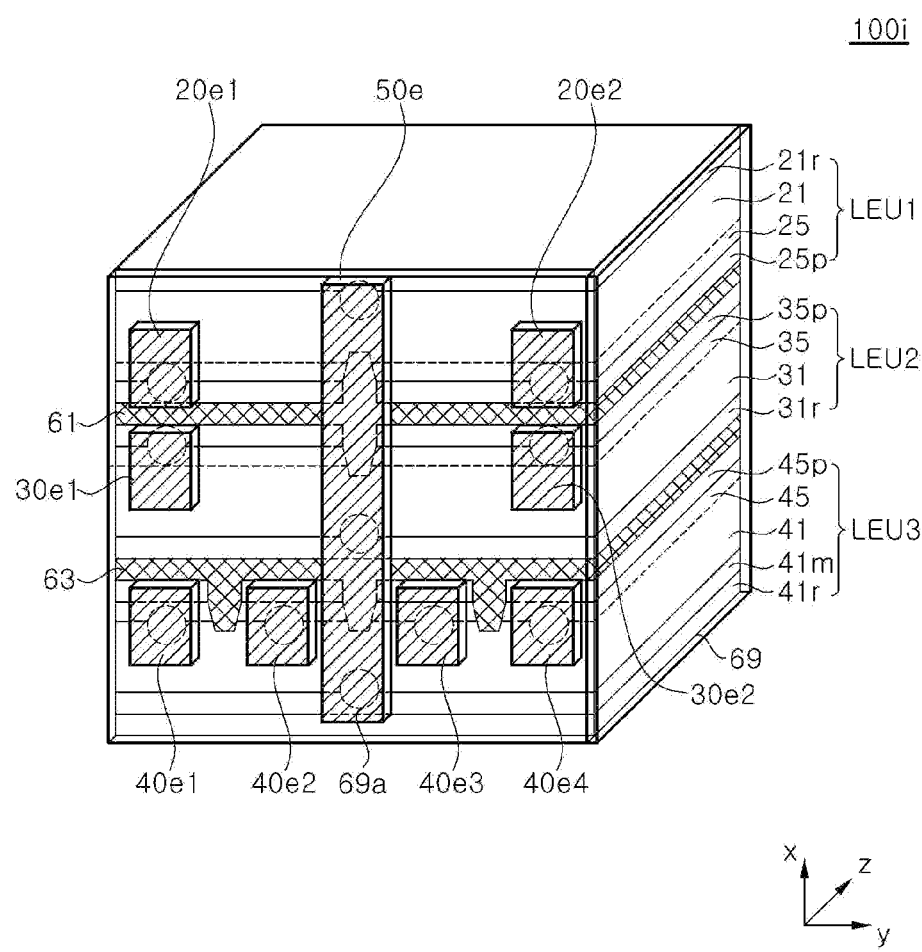
FIG. 23 is a schematic perspective view of yet another light emitting device according to one or more exemplary embodiments of the present disclosure.

FIG. 23 is a schematic perspective view of a light emitting device 100i according to one or more exemplary embodiments of the present disclosure.

Referring to FIG. 23, the light emitting device 100i according to this embodiment is generally similar to the light emitting device 100g described with reference to FIG. 22 except that the second conductivity type semiconductor layer 45 of the third LED unit LEU3 is divided into 4 regions instead of two regions. The third electrodes 40e1, 40e2, 40e3, and 40e4 may be electrically connected to the four regions, respectively. In other embodiments, the second conductivity type semiconductor layer 45 may be divided into three regions or five or more regions.

In one embodiment, one region is first operated and, when the third LED unit LEU3 in light emission through the corresponding region may not work, the other region may be operated. In another embodiment, among divided regions, some regions may be operated and, the certain region that does not operate may be replaced with another region. In a further embodiment, all of divided regions may be operated. In this embodiment, even when there is a region suffering from a problem in generation of light, light can be emitted through the other regions, thereby realizing an image without a repairing process.

Although the second conductivity type semiconductor layer 45 of the third LED unit LEU3 is illustrated as being divided into two or more regions in this embodiment, the second conductivity type semiconductor layer 25 or the second conductivity type semiconductor layer 35 of the first and second LED units LEU1, LEU2 may also be divided into two or more regions.

Figure 24:
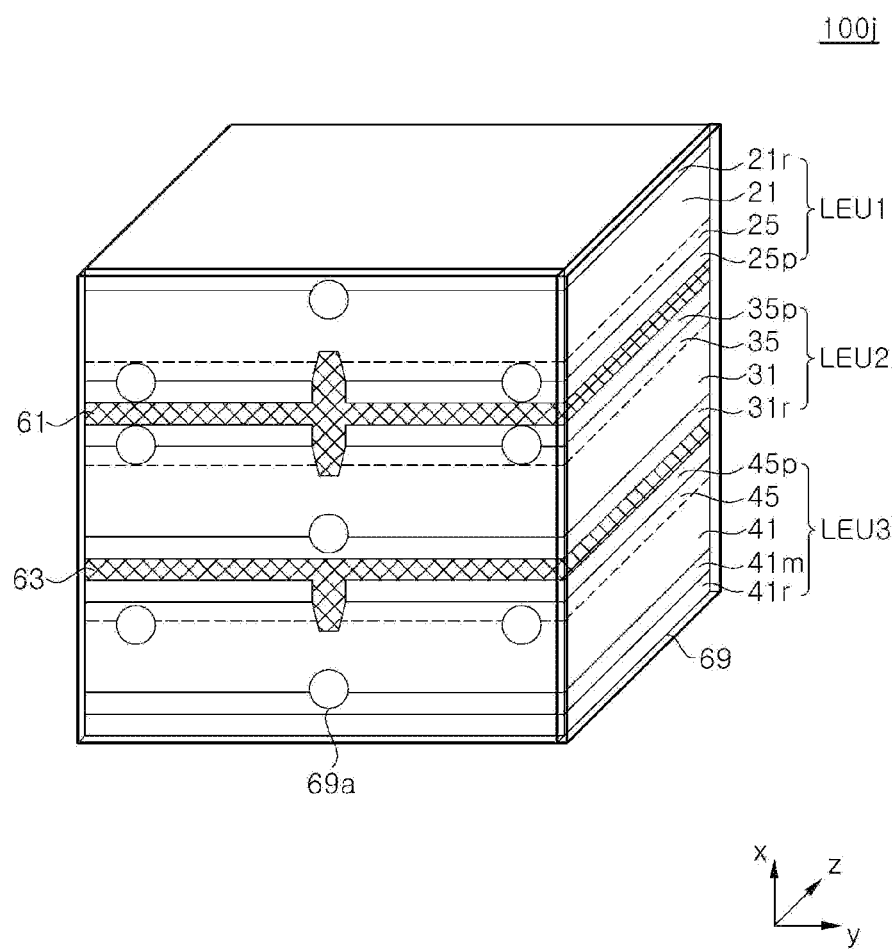
FIG. 24 is a schematic perspective view of yet another light emitting device according to one or more exemplary embodiments of the present disclosure.

FIG. 24 is a schematic perspective view of a light emitting device 100j according to one or more exemplary embodiments of the present disclosure.

Referring to FIG. 24, the light emitting device 100j according to this embodiment is generally similar to the light emitting device 100h described with reference to FIG. 22 except that the electrodes 20e1, 20e2, 30e1, 30e2, 40e1, 40e2, 50e are omitted. The light emitting device 100j includes an insulating layer 69, which has openings 69a providing paths for electrical connection.

The light emitting device 100j may be directly bonded to a circuit board through an electrical connection material, such as solders and the like, without the electrodes 20e1, 20e2, 30e1, 30e2, 40e1, 40e2, 50e.

Although the second conductivity type semiconductor layers 25, 35, 45 are illustrated as being divided into two regions in this embodiment, it should be understood that the present disclosure is not limited thereto and the second conductivity type semiconductor layers may be not divided or may be divided into more regions.

Figure 25:
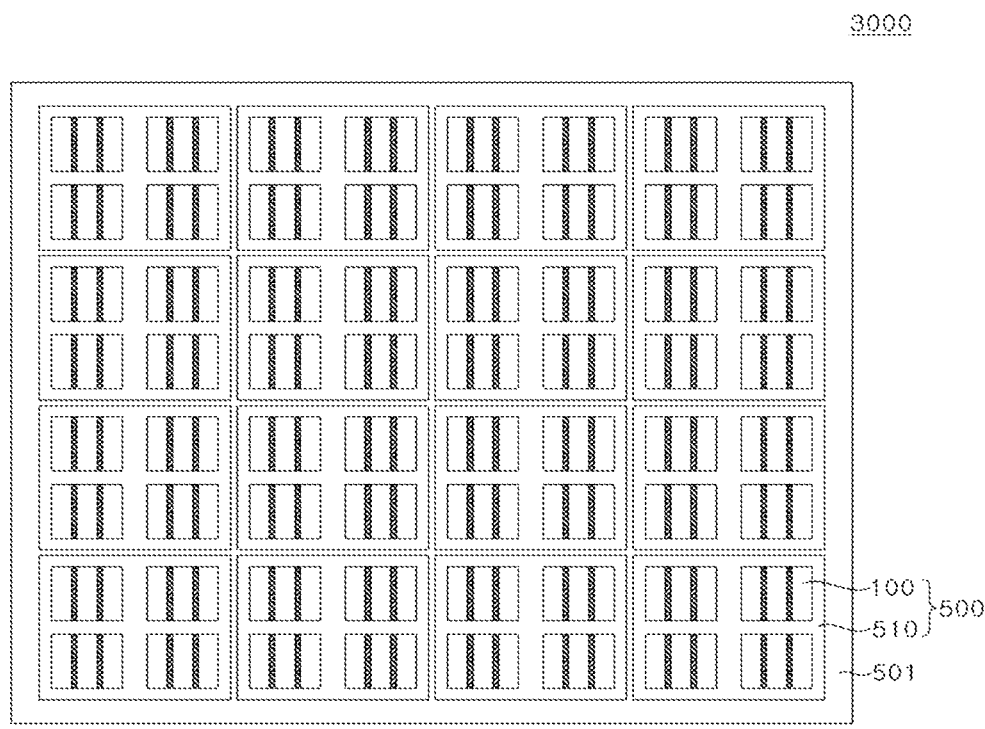
FIG. 25 is a schematic plan view of a display apparatus according to one or more exemplary embodiments of the present disclosure.

FIG. 25 is a schematic plan view of a display apparatus 3000 according to one or more exemplary embodiments of the present disclosure.

Referring to FIG. 25, the display apparatus 3000 includes a display substrate 501 and multiple display units 500. The display substrate 501 serves to support the display units 500 and may be selected from any substrates capable of holding the display units 500. In this embodiment, the display substrate 501 may be a circuit board including circuits, such as TFTs, without being limited thereto. Alternatively, the display substrate 501 may be a substrate not including circuits, for example, a glass substrate.

The display units 500 are arranged on the display substrate 501. The display units 500 may be arranged using a tiling technique. The display units 500 may be attached to the display substrate 501 using various techniques.

The display unit 500 includes a module substrate 510 and light emitting devices 100. As shown in the drawings, the light emitting devices 100 may be arranged in a 2×2 matrix on one module substrate 510, without being limited thereto. For example, the light emitting devices 100 may be arranged in various matrixes such as, 2×2, 3×3, and the like.

Although the light emitting devices 100 are illustrated as being arranged on the module substrate 501 in this embodiment, other light emitting devices 100a, 100b, 100c, 100d, 100e, 100f, 100g, 100h, 100i, or 100j according to various embodiments described above may be arranged.

The light emitting devices 100 are electrically connected to pads on the module substrate 510, in which the pads may be electrically connected to driver(s) for driving the light emitting devices 100. The drivers may be disposed on the display substrate 501, without being limited thereto. Particularly, in arrangement of the multiple display units 500, drivers for operation of the corresponding display units 500 may be disposed on the module substrate 510. In this case, the drivers may be disposed on the back surface of the module substrate 510 and may be electrically connected to the pads through electric wires.

Various techniques may be employed to electrically connect the light emitting devices 100 on the module substrate 510 to the drivers on the back surface of the module substrate 510 and such techniques will be described with reference to FIG. 26A, FIG. 26B, and FIG. 26C.

Figure 26A:
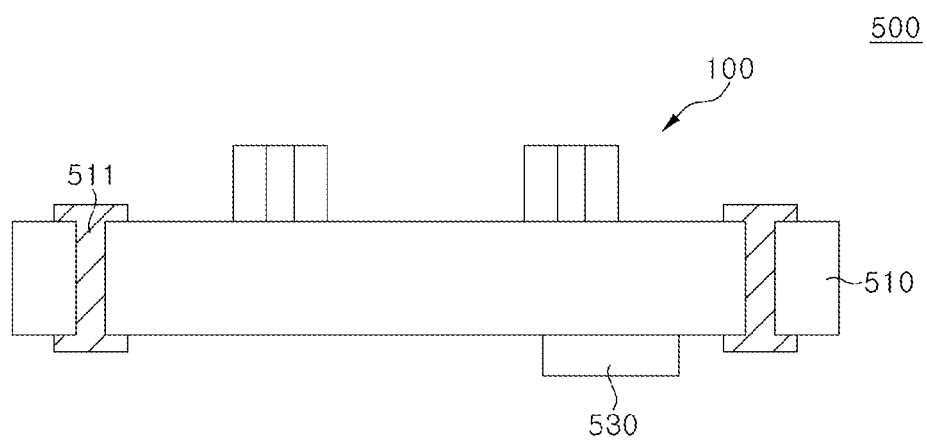
FIG. 26A is a schematic sectional view of another display unit according to one or more exemplary embodiments of the present disclosure.

FIG. 26A is a schematic sectional view of a display unit 500 according to one or more exemplary embodiments of the present disclosure.

Referring to FIG. 26A, the light emitting devices 100 are arranged on the module substrate 510 and drivers 530 may be disposed on the back surface of the module substrate 510. A scan driver for driving scan lines and a data driver for driving data lines may be disposed on the back surface of the module substrate 510.

The light emitting devices 100 are electrically connected to the drivers 530 and may be driven by the drivers 530. Although not shown in the drawings, the light emitting devices 100 are electrically connected to the pads on the module substrate 510, in which the pads may be electrically connected to the drivers 530 through electric wires. Here, connectors 511 connecting wires on an upper surface of the module substrate 510 to wires on the back surface of the module substrate 510 is required for electrical connection between the light emitting devices 100 disposed on the upper surface of the module substrate 510 and the drivers disposed on the back surface of the module substrate 510. In this embodiment, the connectors 511 may be formed in through-holes formed through the module substrate 510. The connectors 511 may be disposed near an edge of the module substrate 510.

Figure 26B:
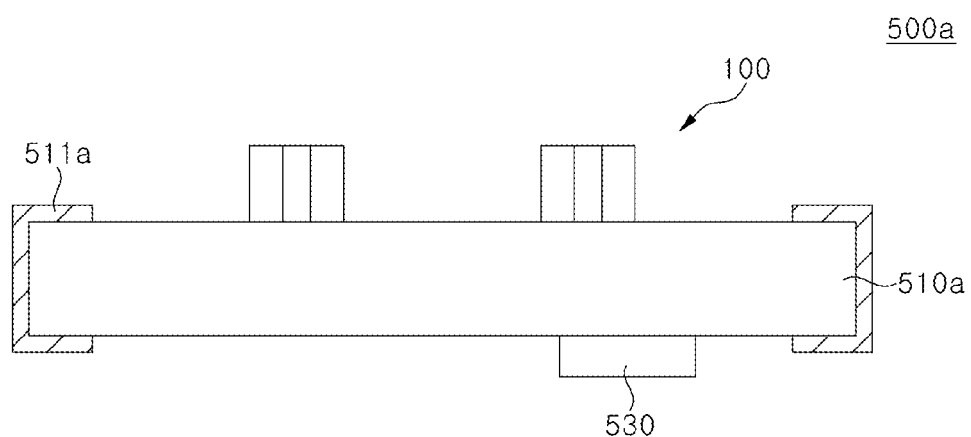
FIG. 26B is a schematic sectional view of yet another display unit according to one or more exemplary embodiments of the present disclosure.

FIG. 26B is a schematic sectional view of a display unit 500*a* according to one or more exemplary embodiments of the present disclosure.

Referring to FIG. 26B, the display unit 500*a* according to this embodiment is generally similar to the display unit 500 described with reference to FIG. 26A except that connectors 511*a* are formed on a side surface of a module substrate 510*a*.

That is, the connectors 511*a* are formed on the side surface of the module substrate 510*a* and connects wires on an upper surface of the module substrate 510*a* to wires formed on a lower surface of the module substrate 510*a* such that the light emitting devices 100 can be electrically connected to the drivers 530.

Figure 26C:
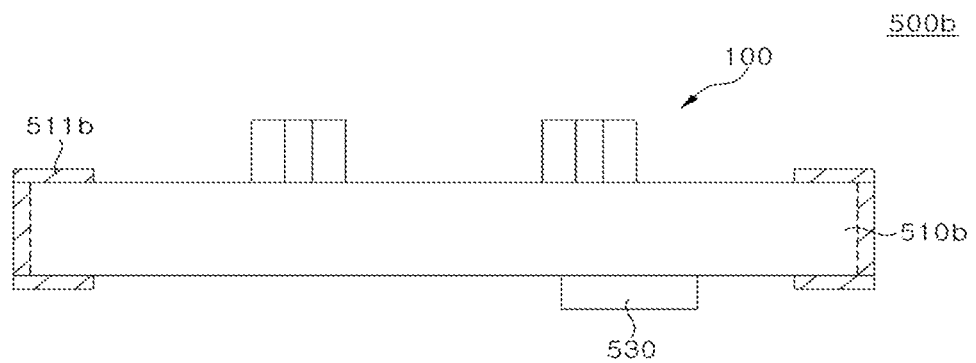
FIG. 26C is a schematic sectional view of further another display unit according to one or more exemplary embodiments of the present disclosure.

FIG. 26C is a schematic sectional view of a display unit 500*b* according to one or more exemplary embodiments of the present disclosure.

Referring to FIG. 26C, the display unit 500*b* according to this embodiment is generally similar to the display unit 500*a* described with reference to FIG. 26B except that a connector 511*b* is disposed in a groove formed on a side surface of a module substrate 510*b*.

That is, the groove is formed on the side surface of the module substrate 510*b* and the connector 511*b* is formed in the groove. Accordingly, it is possible to prevent the connector 511*b* from protruding from the side surface of the module substrate 510*b*. Since the connector 511*b* does not protrude outwardly, the display units 500*b* may be disposed close to each other.

Although some exemplary embodiments and implementations have been described herein, other exemplary embodiments and modifications will be apparent from the above description. Therefore, it should be understood that the present disclosure is not limited to the above embodiments and should be interpreted according to the following appended claims and equivalents thereto.

What is claimed is:

1. A light emitting apparatus comprising:
a substrate;
light emitters arranged in a matrix on the substrate;
a first black material disposed on the substrate;
a driver; and
a connector electrically connected to the driver,
wherein:
the light emitters include a first emitter, a second emitter, and a third emitter;
the second emitter is disposed between the first emitter and the third emitter;
each of the first, second, and third emitters includes a first type semiconductor layer and a second type semiconductor layer, and an active layer disposed between the first type semiconductor layer and the second type semiconductor layer;
the first black material is disposed between the first emitter and the second emitter and is spaced apart from the second emitter with no emitters being disposed between the first black material and the second emitter;
the substrate includes a first side on which the light emitters are disposed, a second side opposite to the first side, and a hole; and
the driver is disposed on the second side of the substrate.

2. The light emitting apparatus according to claim 1, wherein each of the active layers of the first, second, and third emitters includes a same material.

3. The light emitting apparatus according to claim 2, wherein the material is Gallium.

4. The light emitting apparatus according to claim 1, wherein the first type semiconductor layer of the first, second, and third emitters includes a super-lattice structure.

5. The light emitting apparatus according to claim 1, further comprising a light transparent layer disposed on the substrate.

6. The light emitting apparatus according to claim 1, further comprising a second black material, wherein the second black material is disposed between the second emitter and the third emitter.

7. The light emitting apparatus according to claim 1, wherein the second type semiconductor layer of each of the first, second, and third emitters includes a groove and an insulation material covering the groove.

8. A light emitting apparatus comprising:
a substrate;
light emitters arranged on the substrate;
a first black material disposed on the substrate;
a driver; and
a connector electrically connected to the driver,
wherein:
the light emitters include a first emitter, a second emitter, and a third emitter;
the first, second and third emitters are arranged side by side;
each of the first, second, and third emitters includes a first type semiconductor layer and a second type semiconductor layer, and an active layer disposed between the first type semiconductor layer and the second type semiconductor layer;
the first black material is disposed between the first emitter and the second emitter and is spaced apart from the second emitter with no emitters being disposed between the first black material and the second emitter;

the substrate includes a front side on which the light emitters are disposed, a back side opposite to the front side, and a hole;

the driver is disposed on the back side of the substrate; and the connector passes through the hole.

9. The light emitting apparatus according to claim 8, wherein each of the active layers of the first, second, and third emitters includes a same material.

10. The light emitting apparatus according to claim 9, wherein the material is Gallium.

11. The light emitting apparatus according to claim 8, wherein the first type semiconductor layer of the first, second, and third emitters includes a super-lattice structure.

12. The light emitting apparatus according to claim 8, further comprising a light transparent layer disposed on the substrate.

13. The light emitting apparatus according to claim 8, further comprising a second black material, wherein the second black material is disposed between the second emitter and the third emitter.

14. The light emitting apparatus according to claim 8, wherein the second type semiconductor layer of each of the first, second, and third emitters includes a groove and an insulation material covering the groove.

15. A light emitting apparatus comprising:
a substrate;
emitters arranged on the substrate;
a first black material disposed on the substrate;
a driver; and
a connector electrically connected to the driver, wherein:
the emitters include a first emitter and a second emitter;
each of the emitters is arranged on a first side of the substrate;
each of the emitters includes a first type semiconductor layer and a second type semiconductor layer, and an active layer disposed between the first type semiconductor layer and the second type semiconductor layer;
the first black material is disposed between the first emitter and the second emitter and is spaced apart from the second emitter with no emitters being disposed between the first black material and the second emitter;
the driver is disposed at a second side opposite to the first side of the substrate; and
the substrate includes a hole through the substrate and the connector passes through the hole.

16. The light emitting apparatus according to claim 15, wherein each of the active layers of the emitters includes a same material, and wherein the material is Gallium.

17. The light emitting apparatus according to claim 15, wherein the first type semiconductor layer of the emitters includes a super-lattice structure.

18. The light emitting apparatus according to claim 15, further comprising a light transparent layer disposed on the substrate.

19. The light emitting apparatus according to claim 15, wherein the second type semiconductor layer of each of the emitters includes a groove and an insulation material covering the groove.

* * * * *